(12) United States Patent
Lee et al.

(10) Patent No.: US 12,557,422 B2
(45) Date of Patent: Feb. 17, 2026

(54) IMAGE SENSOR

(71) Applicant: SAMSUNG ELECTRONICS CO., LTD., Suwon-si (KR)

(72) Inventors: Junsik Lee, Suwon-si (KR); Junghyun Kim, Suwon-si (KR); Gyeongjin Lee, Suwon-si (KR); Yoongi Joung, Hwaseong-si (KR); Jonghoon Park, Seoul (KR); Yunki Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 314 days.

(21) Appl. No.: 18/117,166

(22) Filed: Mar. 3, 2023

(65) Prior Publication Data
US 2023/0282668 A1 Sep. 7, 2023

(30) Foreign Application Priority Data
Mar. 4, 2022 (KR) .......... 10-2022-0028191

(51) Int. Cl.
*H10F 39/00* (2025.01)
(52) U.S. Cl.
CPC ....... *H10F 39/811* (2025.01); *H10F 39/8053* (2025.01); *H10F 39/8063* (2025.01); *H10F 39/807* (2025.01)
(58) Field of Classification Search
CPC ....... H10F 39/807; H10F 39/802–8027; H10F 39/811; H10F 39/90
See application file for complete search history.

(56) References Cited

U.S. PATENT DOCUMENTS

| 9,025,063 | B2 | 5/2015 | Ahn et al. |
| 9,923,009 | B1 | 3/2018 | Hsiung et al. |
| 10,797,096 | B2 | 10/2020 | Chou et al. |
| 10,923,518 | B2 | 2/2021 | Kim et al. |

(Continued)

FOREIGN PATENT DOCUMENTS

| KR | 10-2013-0134791 A | 12/2013 |
| KR | 10-2018-0136872 A | 12/2018 |

(Continued)

OTHER PUBLICATIONS

Communication issued Oct. 15, 2025 by the Korean Intellectual Property Office in Korean Patent Application No. 10-2022-0028191.

*Primary Examiner* — Mariceli Santiago
(74) *Attorney, Agent, or Firm* — Sughrue Mion, PLLC

(57) ABSTRACT

An image sensor includes a substrate having first and second surfaces opposing each other; a circuit interconnection structure provided below the first surface of the substrate; a group provided in the substrate and including a plurality of pixel substrate regions; and an isolation structure provided in the substrate, wherein the isolation structure includes an isolation portion surrounding the group and extension portions extending from the isolation portion to a region between the plurality of pixel substrate regions of the group, wherein, in the group, the extension portions have end portions spaced apart from each other, and wherein at least one of the extension portions includes a width reduction region in which a width decreases in a direction away from the isolation portion.

20 Claims, 29 Drawing Sheets

(56) References Cited

U.S. PATENT DOCUMENTS

| | | |
|---|---|---|
| 2020/0235149 A1* | 7/2020 | Shiraishi ................. H10F 39/12 |
| 2020/0243579 A1* | 7/2020 | Pyo ....................... H10F 39/813 |
| 2020/0286937 A1 | 9/2020 | Honda et al. |
| 2021/0134863 A1 | 5/2021 | Suzuki |
| 2021/0183920 A1 | 6/2021 | Lee et al. |
| 2022/0123032 A1* | 4/2022 | Lee ..................... H10F 39/8063 |
| 2023/0232125 A1* | 7/2023 | Nakamizo .............. H04N 25/41 |
| | | 257/431 |

FOREIGN PATENT DOCUMENTS

| | | |
|---|---|---|
| KR | 10-2019-0110538 A | 9/2019 |
| KR | 10-2020-0014722 A | 2/2020 |
| KR | 10-2020-0134204 A | 12/2020 |
| KR | 10-2204728 B1 | 1/2021 |

\* cited by examiner

IMAGE SENSOR

CROSS-REFERENCE TO RELATED APPLICATION(S)

This application is based on and claims benefit of priority to Korean Patent Application No. 10-2022-0028191 filed on Mar. 4, 2022 in the Korean Intellectual Property Office, the disclosure of which is incorporated herein by reference in its entirety.

BACKGROUND

Example embodiments of the disclosure relate to an image sensor, and more particularly, an image sensor including an isolation structure.

An image sensor is a semiconductor-based sensor generating an electrical signal by receiving light, and may include a pixel array having a plurality of pixels, a logic circuit for driving the pixel array and generating an image, and the like. Each of the pixels may include a photodiode and a pixel circuit converting electric charges generated by the photodiode into an electric signal.

SUMMARY

An example embodiment of the disclosure is to provide an image sensor which may improve integration density and performance.

According to an aspect of the disclosure, there is provided an image sensor, including a substrate having a first surface and a second surface on an opposite side of the first surface; a circuit interconnection structure provided below the first surface of the substrate; an area group comprising a plurality of pixel substrate regions provided in the substrate; and an isolation structure provided in the substrate, wherein the isolation structure includes: an isolation portion surrounding the area group, and extension portions extending from the isolation portion into a region between a first pixel and a second pixel among the plurality of pixel substrate regions in the area group, wherein, in the area group, the extension portions have end portions spaced apart from each other, and wherein at least one of the extension portions comprises a first region in which a width decreases in a direction away from the isolation portion.

According to an aspect of the disclosure, there is provided an image sensor, including: a lower chip comprising a logic circuit; and an upper chip provided on the lower chip and bonded to the lower chip, wherein the upper chip includes: a substrate having a first surface and a second surface on an opposite side of the first surface; a circuit interconnection structure provided below the first surface of the substrate; a plurality of area groups provided in the substrate, each of the area groups comprising a plurality of pixel substrate regions respectively including a photodiode; an isolation structure provided in the substrate; and microlenses vertically overlapping the plurality of area groups on the second surface of the substrate, wherein a first microlens among the microlenses vertically overlaps a first area group among the plurality of area groups, the first area group comprising a plurality of first pixel substrate regions, among the plurality of pixel substrate regions, wherein the first microlens vertically overlaps the plurality of first pixel substrate regions of the first area group, wherein the isolation structure comprises an isolation portion surrounding each of plurality the area groups, and extension portions extending from the isolation portion to a region between the plurality of pixel substrate regions and spaced apart from each other, wherein each of the extension portions comprises a first region having a first width and a second region having a second width smaller than the first width, and wherein, in each of the extension portions, the first region is provided between the second region and the isolation portion.

According to an aspect of the disclosure, there is provided an image sensor, including: a lower chip comprising a logic circuit; and an upper chip bonded to the lower chip on the lower chip, wherein the upper chip includes: a substrate having a first surface and a second surface on a side opposite to the first surface; a circuit interconnection structure provided below the first surface of the substrate; a plurality of area groups provided in the substrate, each of the plurality of area groups plurality of comprising a plurality of pixel substrate regions respectively including a photodiode; an isolation structure provided in the substrate; and microlenses vertically overlapping the plurality of area groups on the second surface of the substrate, wherein a first microlens among the microlenses vertically overlaps a first area group among the plurality of area groups, the first area group comprising a plurality of first pixel substrate regions, among the plurality of pixel substrate regions, wherein the first microlens vertically overlaps the plurality of first pixel substrate regions of the first area group, wherein the isolation structure includes an isolation portion surrounding each of the plurality of area groups, and extension portions extending from the isolation portion to a region between the plurality of pixel substrate regions and spaced apart from each other, wherein the isolation structure has an inclined side surface, and wherein the isolation structure has a first width in a lower portion adjacent to the first surface of the substrate, and a second width smaller than the first width in an upper portion adjacent to the second surface of the substrate.

BRIEF DESCRIPTION OF DRAWINGS

The above and other aspects, features, and advantages of the disclosure will be more clearly understood from the following detailed description, taken in combination with the accompanying drawings, in which.

DETAILED DESCRIPTION

Figure 1:
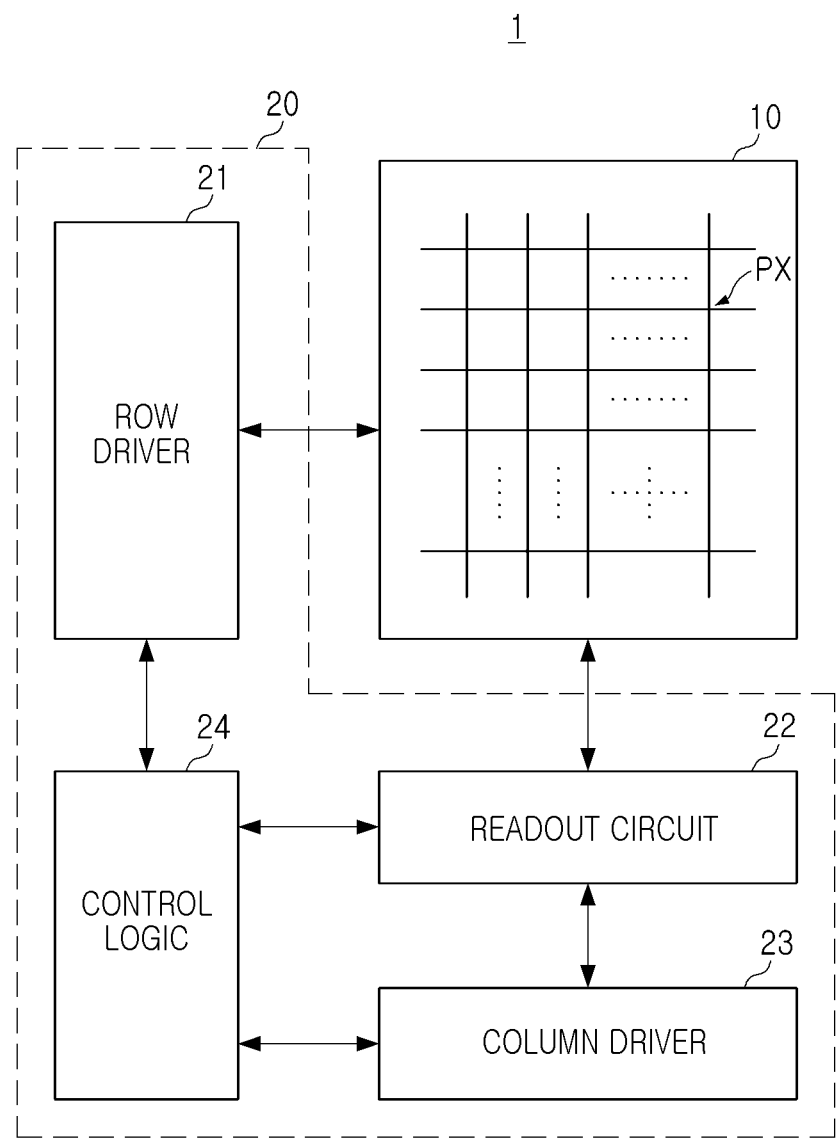
FIG. 1 is a block diagram illustrating an image sensor according to an example embodiment of the disclosure.

Hereinafter, embodiments of the disclosure will be described as follows with reference to the accompanying drawings.

Hereinafter, terms such as 'on,' 'upper portion,' 'upper surface,' 'below,' 'lower portion,' 'lower surface,' 'side surface,' and the like can be understood as referring to based on the drawings, unless otherwise indicated by reference numerals.

FIG. 1 is a block diagram illustrating an image sensor according to an example embodiment.

Referring to FIG. 1, an image sensor 1 may include a pixel array 10 and a logic circuit 20. The pixel array 10 may include a plurality of pixels PX provided in array form along a plurality of rows and a plurality of columns. Each of the plurality of pixels PX may include at least one photoelectric conversion device for generating electric charges in response to light, and a pixel circuit for generating a pixel signal corresponding to the electric charge generated by the photoelectric conversion device. The photoelectric conversion device may include a photodiode formed of a semiconductor material, and/or an organic photodiode formed of an organic material.

For example, the pixel circuit may include a floating diffusion region, a transfer transistor, a reset transistor, a driving transistor, and a select transistor. The configuration of the pixels PX may vary according to example embodiments. For example, each of the pixels PX may include an organic photodiode including an organic material, or may be implemented as a digital pixel. When the pixels PX are implemented as digital pixels, each of the pixels PX may include an analog-to-digital converter for outputting a digital pixel signal.

The logic circuit 20 may include circuits for controlling the pixel array 10. For example, the logic circuit 20 may include a row driver 21, a readout circuit 22, a column driver 23, and a control logic 24. The row driver 21 may drive the pixel array 10 by units of row lines. For example, the row driver 21 may generate a transfer control signal for controlling the transfer transistor of the pixel circuit, a reset control signal for controlling the reset transistor, and a selection control signal for controlling the select transistor and may input the signals to the pixel array 10 by row-line unit.

The readout circuit 22 may include a correlated double sampler (CDS) and an analog-to-digital converter (ADC). The correlated double samplers may be connected to the pixels PX through column lines. The correlated double samplers may read a pixel signal through column lines from the pixels PX connected to a row line selected by a row line selection signal of the row driver 21. The analog-to-digital converter may convert the pixel signal detected by the correlated double sampler into a digital pixel signal and may transmit the signal to the column driver 23.

The column driver 23 may include a latch or a buffer circuit which may temporarily store a digital pixel signal, and an amplifier circuit, and may process the digital pixel signal received from the readout circuit 22. The row driver 21, the readout circuit 22, and the column driver 23 may be controlled by the control logic 24. The control logic 24 may include a timing controller for controlling operation timings of the row driver 21, the readout circuit 22, and the column driver 23.

The pixels PX provided in the same position in the horizontal direction among the pixels PX may share the same column line. In an example, the pixels PX provided in the same position in the vertical direction may be simultaneously selected by the row driver 21 and may output pixel signals through column lines. In an example embodiment, the readout circuit 22 may simultaneously obtain a pixel signal from the pixels PX selected by the row driver 21 through column lines. The pixel signal may include a reset voltage and a pixel voltage, and the pixel voltage may be a voltage in which electric charges generated in response to light in each of the pixels PX are reflected to the reset voltage.

Figure 2A:
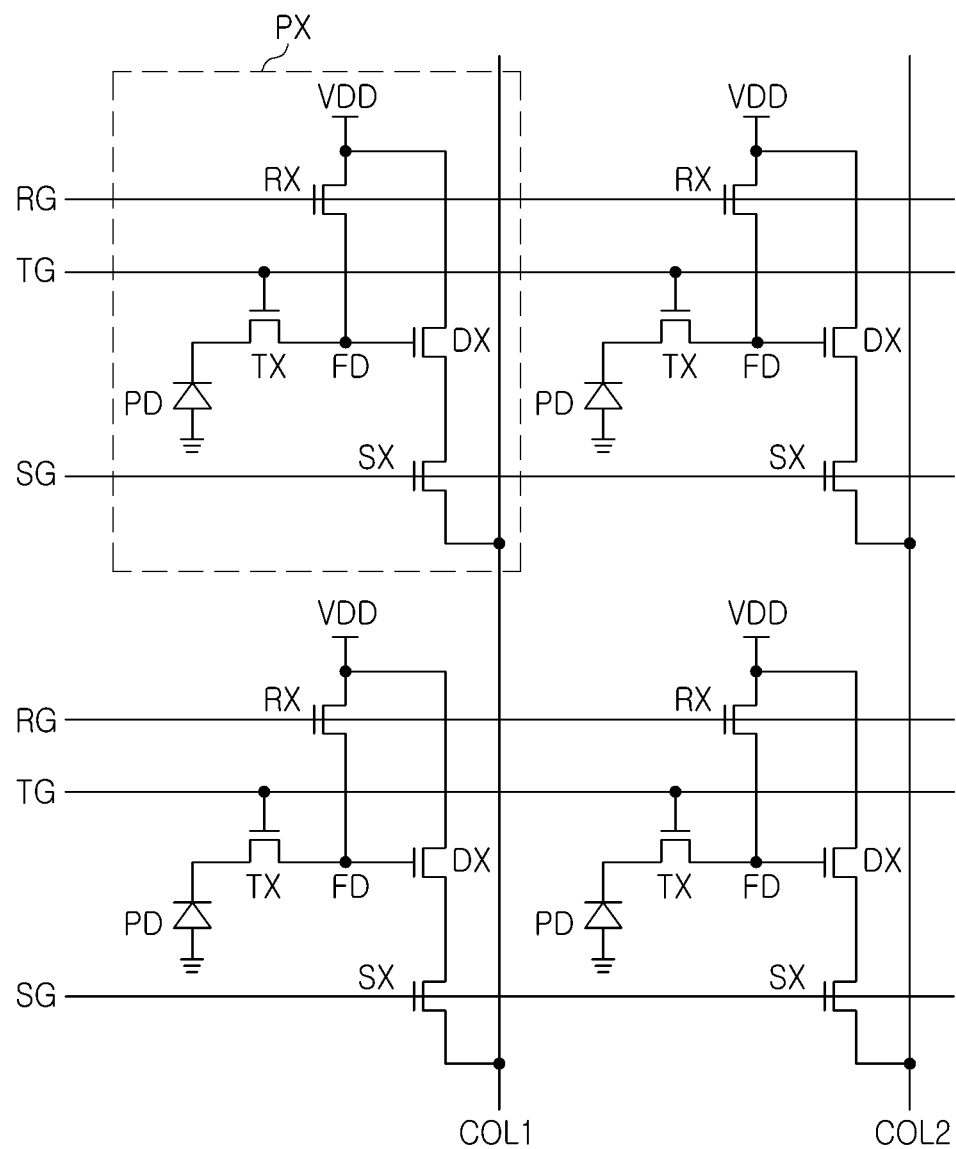
FIGS. 2A and 2B are diagrams illustrating examples of a pixel circuit of an image sensor according to an example embodiment of the disclosure.
Figure 2B:
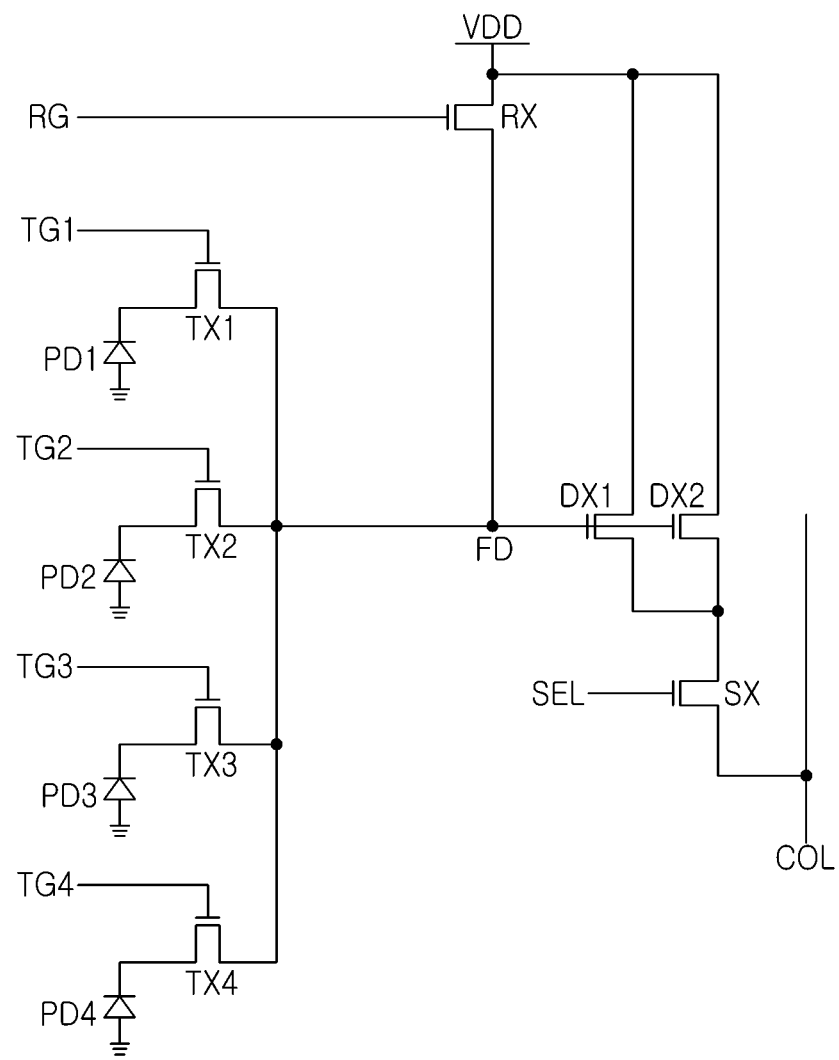

In the description below, various examples of a pixel circuit of an image sensor according to an example embodiment will be described with reference to FIGS. 2A and 2B. FIGS. 2A and 2B are diagrams illustrating examples of a pixel circuit of an image sensor according to an example embodiment.

In an example embodiment, referring to FIGS. 1 and 2A, each of the plurality of pixels PX may include a photodiode PD and a pixel circuit, and the pixel circuit may include a transfer transistor TX, a reset transistor RX, a select transistor SX, and a driving transistor DX.

The photodiode PD may generate and accumulate electric charges in response to incident light. The pixel circuit may further include a floating diffusion region FD in which electric charges generated by the photodiode PD are accumulated.

The photodiode PD may be replaced with a phototransistor, a photogate, or a pinned photodiode in example embodiments. The photodiode PD may be referred to and described as a "photoelectric conversion device." Accordingly, the photoelectric conversion device may be a photodiode, a phototransistor, a photogate, or a pinned photodiode.

The transfer transistor TX may transfer electric charges generated in the photodiode PD to the floating diffusion region FD. The floating diffusion region FD may store electric charges generated by the photodiode PD. A voltage output by the driving transistor DX may vary depending on the amount of electric charge accumulated in the floating diffusion region FD.

The reset transistor RX may reset the voltage of the floating diffusion region FD by removing electric charges accumulated in the floating diffusion region FD. A drain electrode of the reset transistor RX may be connected to the floating diffusion region FD, and a source electrode of the reset transistor RX may be connected to a power voltage VDD. When the reset transistor RX is turned on, the power supply voltage VDD connected to the source electrode of the reset transistor RX may be applied to the floating diffusion region FD, and the electric charges accumulated in the floating diffusion region FD may be removed.

The driving transistor DX may operate as a source follower buffer amplifier. The driving transistor DX may amplify a change in voltage in the floating diffusion region FD and may output the voltage to one of the column lines COL1 and COL2. The select transistor SX may select the pixels PX to be read in row units. When the select transistor SX is turned on, the voltage of the driving transistor DX may be output to one of the column lines COL1 and COL2. When the select transistor SX is turned on, a reset voltage or a pixel voltage may be output through the column lines COL1 and COL2.

In the example embodiment illustrated in FIG. 2A, each of the plurality of pixels PX may include the photodiode PD and the transfer transistor TX, and may also include the reset transistor RX, the select transistor SX and the driving transistor DX, but an example embodiment thereof is not limited thereto, and the example embodiment may be modified as illustrated in FIG. 2B.

According to another example embodiment, referring to FIGS. 1 and 2B, two or more pixels adjacent to each other may share at least a portion of the transistors included in the pixel circuit. For example, four adjacent pixels may share a floating diffusion region FD, a reset transistor RX, first and second driving transistors DX1 and DX2, and a select transistor SX.

In an example embodiment, the first photodiode PD1 of the first pixel and the first transfer transistor TX1 may be connected to the floating diffusion region FD. Similarly, the second photodiode PD2, the third photodiodes PD3, and the fourth photodiode PD4 of the second pixel, the third pixel and the fourth pixel may be connected to the floating diffusion region FD through the second transfer transistor TX2, the third transfer transistor TX3 and the fourth transfer transistor TX4, respectively.

In an example embodiment, by connecting the floating diffusion regions FD included in the pixels to each other using a interconnection pattern, the first to fourth transfer transistors TX1-TX4 may be connected to the floating diffusion region FD in common.

In another example embodiment, the floating diffusion regions FD included in the pixels may be integrated with each other as a single region in a substrate which may be formed of a semiconductor material.

The pixel circuit may include the reset transistor RX, the first and second driving transistors DX1 and DX2, and the select transistor SX. The reset transistor RX may be controlled by a reset control signal RG, and the select transistor SX may be controlled by a selection control signal SEL. For example, each of the four pixels may further include a transistor in addition to the transfer transistor TX. Two of the four transistors included in the four pixels may be connected to each other in parallel and may provide the first and second driving transistors DX1 and DX2. One of the other two transistors may be provided as the select transistor SX, and the other may provide the reset transistor RX.

The pixel circuit described with reference to FIG. 2B is only an example, and is not necessarily limited to the above example. For example, one of the four transistors may be provided as a driving transistor and another transistor may be provided as a select transistor. Also, by connecting the other two transistor to each other in series and allocating the first and second reset transistors, an image sensor adjusting a conversion gain of a pixel may be implemented. Alternatively, the pixel circuit may vary according to the number of transistors included in each of the pixels. As described above, the pixel circuits described with reference to FIGS. 2A and 2B may be examples for implementing the image sensor according to an example embodiment, and an example embodiment thereof is not limited thereto.

In the description below, an example of the image sensor structure according to an example embodiment will be described with reference to FIGS. 3, 4A and 4B.

Figure 3:
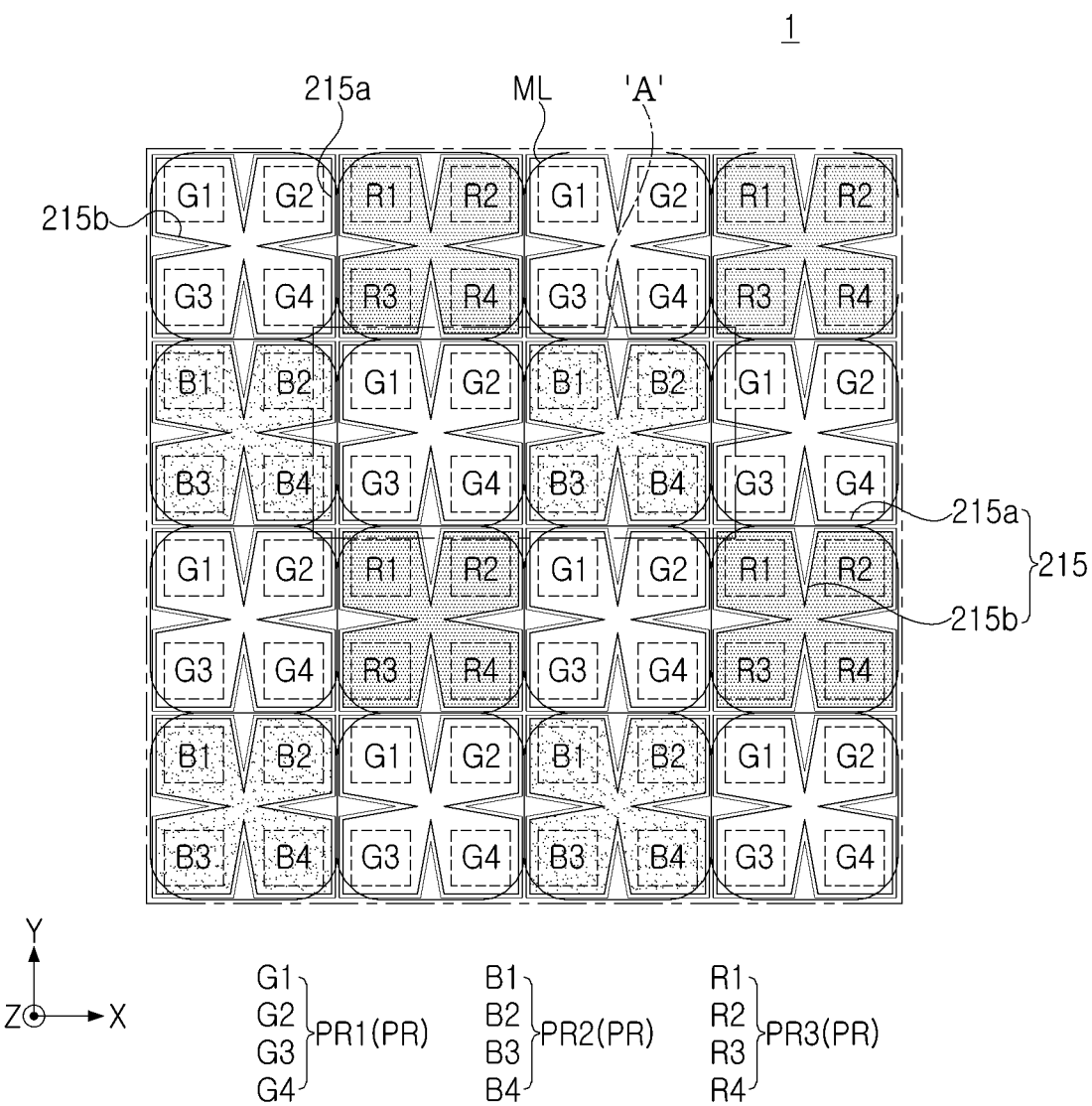
FIGS. 3, 4A, and 4B are diagrams illustrating an image sensor according to an example embodiment of the disclosure.
Figure 4A:
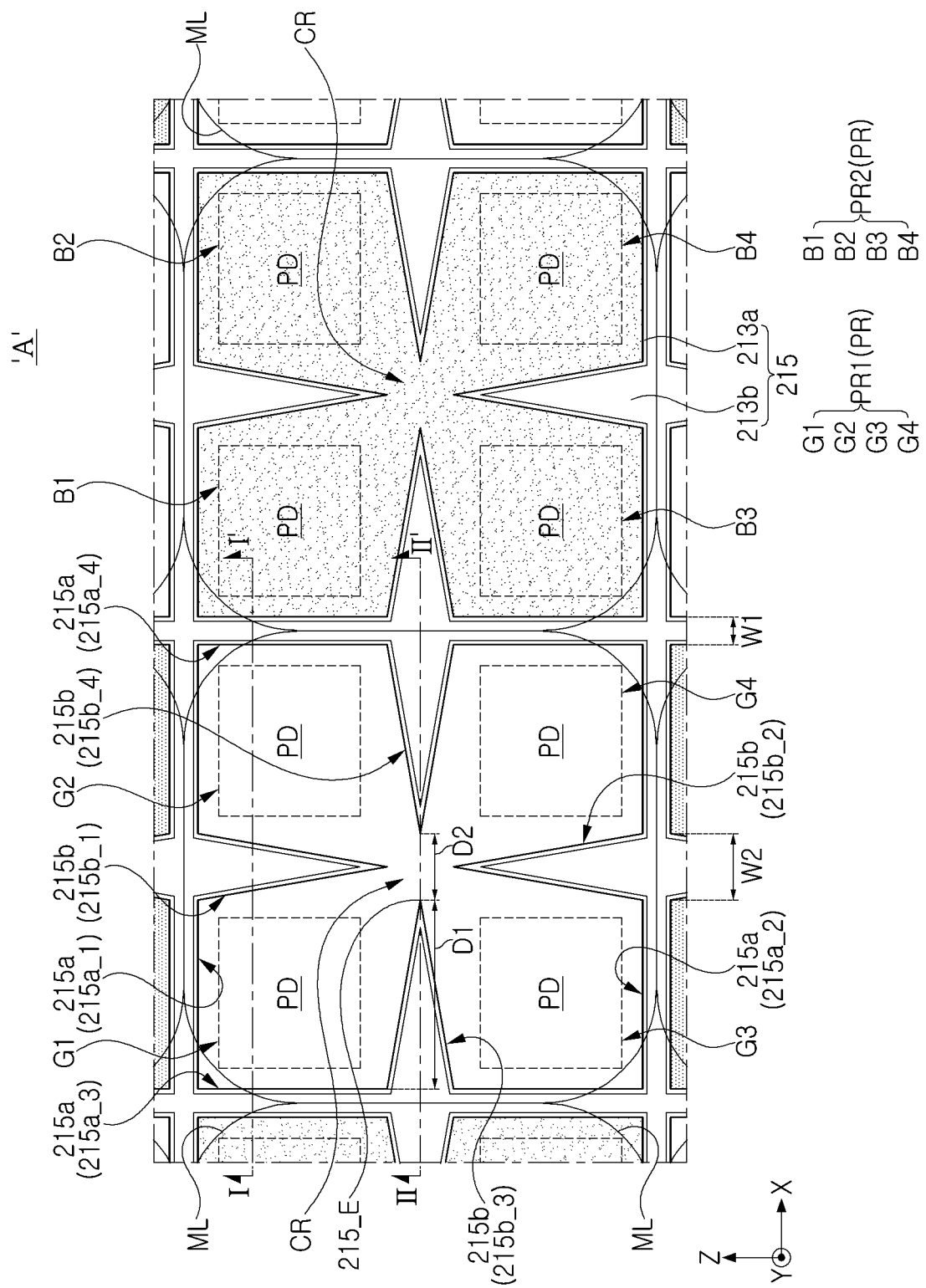
Figure 4B:
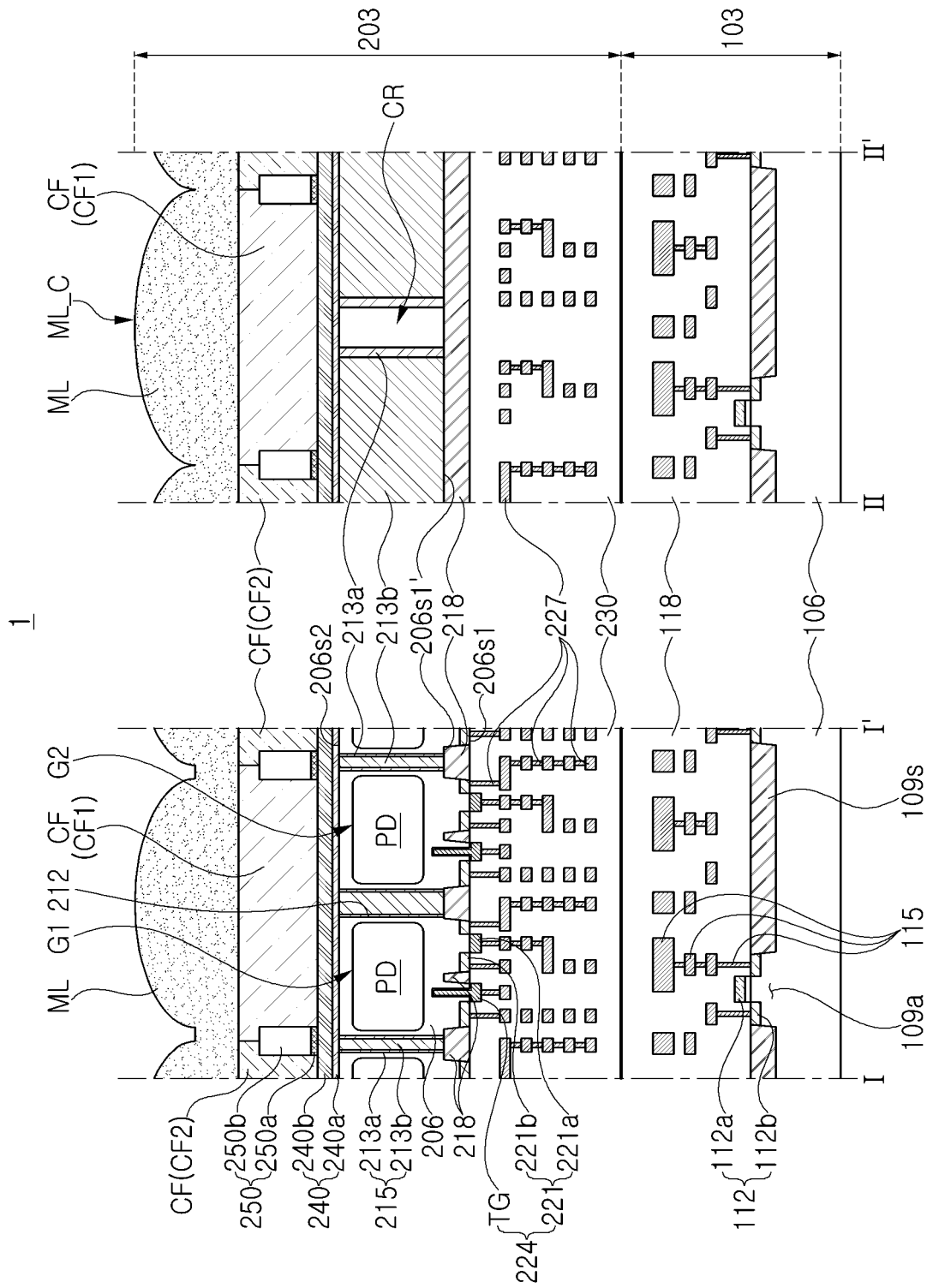

FIGS. 3, 4A, and 4B are diagrams illustrating an image sensor according to an example embodiment, FIG. 3 is a diagram illustrating an image sensor according to an example embodiment, FIG. 4A is an enlarged diagram illustrating region "A" in FIG. 3, and FIG. 4B is a cross-sectional diagram taken along lines I-I' and II-II' in FIG. 4A.

Referring to FIGS. 3, 4A, and 4B, the image sensor 1 according to the example embodiment may have a stack chip structure which includes at least two stacked chips. For example, the image sensor 1 may include a first chip structure 103 and a second chip structure 203 on the first chip structure 103. The first chip structure 103 may be a logic chip, and the second chip structure 203 may be an image sensor chip. In another example embodiment, the first chip structure 103 may be a stack chip structure including a logic chip and a memory chip.

The first chip structure 103 of the image sensor 1 may include a first substrate 106, a device isolation layer 109s, an active region 109a on the first substrate 106, a first circuit device 112 and a first interconnection structure 115 on the first substrate 106, and a first insulating structure 118 covering the first circuit device 112 and the first interconnection structure 115 on the first substrate 106. According to an example embodiment, the active region 109a may be defined by the device isolation layer 109s.

The first substrate 106 may be a semiconductor substrate. For example, the first substrate 106 may be a substrate formed of a semiconductor material, such as, for example, a single crystal silicon substrate. The first circuit device 112 may include a device such as a transistor including a gate 112a and a source/drain 112b.

The second chip structure 203 may include a second substrate 206 having a first surface 206s1 and a second surface 206s2 opposing each other, a device isolation layer 218 provided on the first surface 206s1 of the second substrate 206 and defining an active region, a second circuit device 224 and a second interconnection structure 227 provided between the first surface 206s1 of the second substrate 206 and the first chip structure 103, and a second insulating structure 230 covering the second circuit device 224 and the second interconnection structure 227 between the first surface 206s1 of the second substrate 206 and the first chip structure 103. The first surface 206s1 of the second substrate 206 may oppose the first chip structure 103. The device isolation layer 218 may be formed of an insulating material such as silicon oxide. The second circuit device 224 and the second interconnection structure 227 provided below the first surface 206s1 of the second substrate 206 may form a circuit interconnection structure. Accordingly, a circuit interconnection structure may be provided below the first surface 206s1 of the second substrate 206.

According to an example embodiment, the bottom surface of the device isolation layer 218 may be referred to as a second surface 206s1' of the substrate 206.

The second substrate 206 may be a semiconductor substrate. For example, the second substrate 206 may be a substrate formed of a semiconductor material, such as, for example, a single crystal silicon substrate.

Referring to FIGS. 3 and 4A, the image sensor 1 may further include a plurality of groups PR provided in the second substrate 206.

Each of the plurality of groups PR may include a plurality of pixel substrate regions. For example, the plurality of groups PR may include a first group PR1, a second group PR2, and a third group PR3, the first group PR1 may include a plurality of pixels substrate regions G1, G2, G3, and G4, the second group PR2 may include a plurality of pixel substrate regions B1, B2, B3 and B4, and the third group PR3 may include a plurality of pixel substrate regions R1, R2, R3, and R4.

The plurality of pixel substrate regions G1, G2, G3, G4, B1, B2, B3, B4, R1, R2, R3, and R4 may include photoelectric conversion devices PD. For example, one of the plurality of pixel substrate regions G1, G2, G3, G4, B1, B2, B3, B4, R1, R2, R3, R4 may include at least one photoelectric conversion device PD. The photoelectric conversion devices PD may generate and accumulate electric charges corresponding to incident light. For example, the photoelectric conversion devices PD may include a photodiode, a phototransistor, a photogate, a pinned photodiode (PPD), and combinations thereof.

Each of the photoelectric conversion devices PD may be a photodiode which may be formed in the second substrate 206. Accordingly, each of the plurality of pixel substrate regions G1, G2, G3, G4, B1, B2, B3, B4, R1, R2, R3, and R4 may include a photodiode.

In example embodiments, the plurality of pixel substrate regions G1, G2, G3, G4, B1, B2, B3, B4, R1, R2, R3, and R4 may be referred to as photoelectric conversion devices PD or photodiodes.

The second chip structure 203 may further include an isolation structure 215. The isolation structure 215 may be provided to surround each of the photoelectric conversion devices PD. The isolation structure 215 may vertically penetrate at least a portion of the second substrate 206. For example, the isolation structure 215 may vertically penetrate the second substrate 206. The isolation structure 215 may be provided in the isolation trench 212 vertically penetrating the second substrate 206. The isolation structure 215 may be connected to the device isolation layer 218. Accordingly, the isolation structure 215 may penetrate the second substrate 206 provided between the device isolation layer 218 and the second surface 206s2 of the second substrate 206. The isolation structure 215 may have a substantially vertical side surface.

The isolation structure 215 may include an isolation pattern 213b and an isolation insulating layer 213a covering side surfaces of the isolation pattern 213b. For example, the isolation insulating layer 213a may include silicon oxide, and the isolation pattern 213b may include polysilicon. The isolation pattern 213b may be referred to as a silicon pattern or a polysilicon pattern. The isolation insulating layer 213a may be formed of a single material layer.

The isolation pattern 213b may be formed of a material applying a voltage to the isolation pattern 213b to reduce or prevent interference or influence between the photoelectric conversion devices PD. For example, the isolation pattern 213b may include a conductive material, such as, for example, doped polysilicon. In an example embodiment, the isolation pattern 213b may be formed of doped polysilicon having N-type conductivity. In another example embodiment, the isolation pattern 213b may be formed of doped polysilicon having P-type conductivity.

In FIGS. 3 and 4A, the isolation structure 215 may include an isolation portion 215a surrounding each of the groups PR, and extension portions 215b extending from the isolation portion 215a into a region between the plurality of pixel substrates regions G1, G2, G3, G4, B1, B2, B3, B4, R1, R2, R3, and R4. The extension portions 215b may have end portions spaced apart from each other in each of the groups PR. In the isolation structure 215, the isolation pattern 213b may be provided in the isolation portion 215a and may extend into the extension portions 215b.

Each of the extension portions 215b may include a first region having a first width and a second region having a second width smaller than the first width. In each of the extension portions 215b, the first region may be provided between the second region and the isolation portions 215a.

In each of the extension portions 215b, a width may gradually decrease from the first region to the second region. Accordingly, at least one of the extension portions 215b may include a width reduction region of which a width decreases in a direction away from the isolation portions 215a. The width of the at least one width reduction region of the extension portions 215b may gradually decrease from an region adjacent to the isolation portions 215a in a direction away from the isolation portions 215a. An end portion of the at least one of the extension portions 215b may have a pointed shape. In the isolation pattern of the at least one of the extension portions 215b, the amount of polysilicon in the isolation pattern 213b may decrease from the isolation portion 215a toward the end portion 215_E of the at least one of the extension portions 215b.

One of the groups PR, for example, the first group PR1, will be mainly described with reference to FIG. 4A.

Referring to FIG. 4A, the number of the plurality of pixel substrate regions G1, G2, G3, and G4 of the first group PR1 may be four. For example, the plurality of pixel substrate regions G1, G2, G3, and G4 of the first group PR1 may include first to fourth pixel substrate regions G1, G2, G3 and G4. The first and second pixel substrate regions G1 and G2 may be adjacent to each other in a first direction X, the third and fourth pixel substrate regions G3 and G4 may be adjacent to each other in the first direction X, the first and third pixel substrate regions G1 and G3 may be adjacent to each other in a second direction Y perpendicular to the first direction X, and the second and fourth pixel substrate regions G2 and G4 may be adjacent to each other in the second direction Y. Accordingly, the first to fourth pixel substrate regions G1, G2, G3, and G4 may be provided in sequence in a clockwise direction. A region in the second substrate 206 provided between the first to fourth pixel substrate regions G1, G2, G3, and G4 may be defined as an "intermediate substrate region CR."

The isolation portion 215a of the isolation structure 215 may include a first line portion 215a_1 and a second line portion 215a_2 parallel to each other, and a third line portion 215a_3 and a fourth line portion 215a_4 parallel to each other. Each of the first and second line portions 215a_1 and 215a_2 may have a line shape or a bar shape extending in the first direction, which is the X direction. Each of the third and fourth line portions 215a_3 and 215a_4 may have a line shape or a bar shape extending in a second direction, which is the Z direction, perpendicular to the first direction (i.e., the X direction). The first to fourth line portions 215a_1, 215a_2, 215a_3, and 215a_4 may surround the first group PR1.

In the isolation structure 215, the extension portions 215b extending from the first to fourth line portions 215a_1, 215a_2, 215a_3, and 215a_4 of the isolation portion 215a may include first to fourth extension portions 215b_1, 215b_2, 215b_3, and 215b_4.

The first extension portion 215b_1 may extend in a direction from the first line portion 215a_1 toward the second line portion 215a_2. The second extension portion 215b_2 may extend from the second line portion 215a_2 toward the first line portion 215a_1. The third extension portion 215b_3 may extend in a direction from the third line portion 215a_3 toward the fourth line portion 215a_4. The fourth extension portion 215b_4 may extend from the fourth line portion 215a_4 toward the third line portion 215a_3. The first to fourth extension portions 215b_1, 215b_2, 215b_3, and 215b_4 may surround the first group PR1. The first to fourth extension portions 215b_1, 215b_2, 215b_3, and 215b_4 may be spaced apart from each other. Each of the first to fourth extension portions 215b_1, 215b_2, 215b_3, and 215b_4 may include a pointed end portion 215_E. The intermediate substrate region CR may be provided between the end portions 215_E of the first to fourth extension portions 215b_1, 215b_2, 215b_3, and 215b_4.

Each of the first to fourth extension portions 215b_1, 215b_2, 215b_3, and 215b_4 may include a width reduction region. A width of the width reduction region of the first extension portion 215b_1 may gradually decrease in a direction from the first line portion 215a_1 toward the second line portion 215a_2. The width of the width reduction region of the second extension portion 215b_2 may gradually decrease in a direction from the second line portion 215a_2 toward the first line portion 215a_1. The width of the width reduction region of the third extension portion 215b_3 may gradually decrease in a direction from the third line portion 215a_3 toward the fourth line portion 215a_4. The width of the width reduction region of the fourth extension portion 215b_4 may gradually decrease in a direction from the fourth line portion 215a_4 toward the third line portion 215a_3.

Each of the first to fourth extension portions 215b_1, 215b_2, 215b_3, and 215b_4 may have a maximum width W2.

A length D1 of each of the first to fourth extension portions 215b_1, 215b_2, 215b_3, and 215b_4 may be greater than the maximum width W2.

The spacing distance D2 between the first and second extension portions 215b_1 and 215b_2 and the spacing distance D2 between the third and fourth extension portions 215b_3 and 215b_4 may be substantially the same. The spacing distance D2 between the first and second extension portions 215b_1 and 215b_2 may be less than a length D1 of each of the first to fourth extension portions 215b_1, 215b_2, 215b_3, and 215b_4.

Each of the first to fourth line portions 215a_1, 215a_2, 215a_3, and 215a_4 may have a first width W1.

In an example embodiment, the maximum width W2 of each of the first to fourth extension portions 215b_1, 215b_2, 215b_3, 215b_4 may be greater than the first width W1 of each of the first to fourth line portions 215a_1, 215a_2, 215a_3, and 215a_4. The maximum width W2 may be equal to or less than about four times the first width W1.

In another example embodiment, the maximum width W2 of each of the first to fourth extension portions 215b_1, 215b_2, 215b_3, 215b_4 may be substantially equal to the first width W1 of each of the first to fourth line portions 215a_1, 215a_2, 215a_3, and 215a_4.

Accordingly, the maximum width W2 may be equal to or greater than the first width W1 and may be equal to or less than about four times the first width W1.

Referring back to FIGS. 3, 4A and 4B, the second circuit device 224 may include a transfer gate TG and active devices 221. The active devices 221 may be transistors including a gate 221a and a source/drain 221b. The transfer gate TG may transfer electric charges from the adjacent photoelectric conversion device PD to the adjacent floating diffusion region. The active devices 221 may be various transistors of the pixel circuit described with reference to FIGS. 2A and 2B, that is, for example, a driving transformer, a reset transistor, and a select transistor.

The transfer gate TG may be a vertical transfer gate including a portion extending into the second substrate 206 from the first surface 206s1 of the second substrate 206.

The second interconnection structure 227 may include a plurality of layers of interconnections provided on different levels, and vias electrically connecting the plurality of layers of interconnections and electrically connecting the plurality of layers of interconnections to the second circuit device 224.

The first insulating structure 118 and the second insulating structure 230 may be in contact with and bonded to each other. Each of the first and second insulating structures 118 and 230 may be formed in multiple layers including different types of insulating layers. For example, the second insulating structure 230 may be formed in multiple layers including at least two types of a silicon oxide layer, a low dielectric layer, and a silicon nitride layer.

The second chip structure 203 may further include an insulating structure 240 provided on the second surface 206s2 of the second substrate 206. The insulating structure 240 may cover the isolation structure 215.

The insulating structure 240 may include an anti-reflection layer which may prevent reflection of light caused by a sudden change in refractive index on the second surface 206s2 of the second substrate 206 which may be formed of silicon. The insulating structure 240 may include an anti-reflection layer providing incident light to travel to the photoelectric conversion devices PD with high transmittance by adjusting a refractive index. The insulating structure 240 may be referred to as an anti-reflection structure or an anti-reflection layer.

The insulating structure 240 may include a plurality of layers stacked in sequence. For example, the insulating structure 240 may include a lower layer 240a and an upper layer 240b on the lower layer 240a. The lower layer 240a may be in contact with the second surface 206s2 of the substrate 206. The lower layer 240a may have transmittance at a visible wavelength, and may include a material having a negative electric charge to prevent electric charge by a dangling bond of the second surface 206s2 of the substrate 206. The upper layer 240b may have transmittance at a visible wavelength, and may include a first upper material layer which may control a peak of transmittance by controlling a thickness and a second upper material layer which may have transmittance at a visible wavelength and may be passivated. The lower layer 240a may include a material having a first refractive index, such as, for example, a material having a refractive index of about 2, and the first upper material layer of the upper layer 240b may include material having a second refractive index smaller than the first refractive index, such as, for example, a material having a refractive index of about 1.5, and the second upper material layer of the upper layer 240b may include a material having a refractive index greater than the second refractive index, that is, for example, a material having a refractive index of about 2. The lower layer 240a may include a high-k dielectric, such as, for example, aluminum oxide. The upper layer 240b may include at least one high dielectric layer and at least one silicon oxide layer.

The second chip structure 203 may further include a grid structure 250. The grid structure 250 may be provided on the insulating structure 240.

The grid structure 250 may include a first layer 250a and a second layer 250b stacked in sequence. The first layer 250a may be in contact with the insulating structure 240. A thickness of the second layer 250b may be greater than a thickness of the first layer 250a.

The first layer 250a may include a first material, and the second layer 250b may include a second material different from the first material.

In an example embodiment, the first material of the first layer 250a may include a conductive material. For example, the first layer 250a may be formed of a conductive material including at least one of a metal or a metal nitride. For example, the first layer 250a may include at least one of Ti, Ta, TiN, TaN, and W.

In an example embodiment, the second material of the second layer 250b may include an insulating material. The second material of the second layer 250b may be a low refractive index (LRI) material. For example, the refractive index of the second layer 250b may be in a range of about 1.1 to about 1.8. The second layer 250b may include an oxide or nitride including Si, Al, or a combination thereof. For example, the second layer 250b may include silicon oxide having a porous structure or silica nanoparticles having a network structure.

The first layer 250a formed of a conductive material may work as an electric charge path for removing an electric charge, and the second layer 250b may not include a conductive material which may reduce sensitivity in the pixel regions and may be formed of a low refractive index (LRI) material, such that the optical cross-talk phenomenon of the image sensor 1 may be addressed.

The second chip structure 203 may include color filters CF. For example, the color filters CF may include color filters CF1 and CF2 of different colors. For example, the color filters CF may include green color filters, blue color filters, and red color filters.

The color filters CF may be provided on the insulating structure 240. The color filters CF may allow light of a specific wavelength to pass therethrough and to reach the photoelectric conversion devices PD. For example, the color filters CF may be formed of a material in which a pigment including a metal or a metal oxide is mixed with a resin. A thickness of each of the color filters CF may be greater than a thickness of the grid structure 250. The color filters CF may cover the grid structure 250 on the insulating structure 240. The color filters CF may cover side surfaces and upper surfaces of the grid structure 250 on the insulating structure 240.

The color filters CF may vertically overlap the plurality of groups PR. For example, one of the color filters CF may vertically overlap one of the plurality of groups PR. Accordingly, each of the color filters CF may vertically overlap the plurality of pixel substrate regions. For example, one of the color filters CF may vertically overlap four pixel substrate regions among the plurality of pixel substrate regions. For example, the first to fourth pixel substrate regions G1, G2, G3, and G4 of the first group PR1 may overlap vertically a first color filter CF1 of the color filters CF.

In an example embodiment, the grid structure 250 may be provided between filters of different colors among the color filters CF. For example, the grid structure 250 may be provided between a color filter CF1 of a first color and a color filter CF2 of a second color different from the first color.

In an example embodiment, the grid structure 250 may vertically overlap the line portions 215a of the isolation structure 215.

In an example embodiment, the grid structure 250 may have a width different from that of the line portions 215a of the isolation structure 215. For example, the width of the grid structure 250 may be greater than the width of each of the line portions 215a of the isolation structure 215.

The second chip structure 203 may further include microlenses ML on the color filters CF.

The microlenses ML may vertically overlap the color filters CF. The microlenses ML may vertically overlap the plurality of groups PR, respectively. For example, one not the microlenses ML may vertically overlap one of the plurality of groups PR. Accordingly, each of the microlenses ML may vertically overlap the plurality of pixel substrate regions. For example, one of the microlenses ML may vertically overlap four pixel substrate regions among the plurality of pixel substrate regions. For example, the first to fourth pixel substrate regions G1, G2, G3, and G4 of the first group PR1 may vertically overlap one of the microlenses ML. Accordingly, each of the microlenses ML may vertically overlap a plurality of photoelectric conversion devices PD among the photoelectric conversion devices PD.

Each of the microlenses ML may have a curved shape, curved in a direction away from the first chip structure 103. The microlenses ML may condense incident light into the photoelectric conversion devices PD. The microlenses ML may be formed of a transparent photoresist material or a transparent thermosetting resin material. For example, the microlenses ML may be formed of a TMR-based resin (manufactured by Tokyo Ohka Kogo, Co.) or an MFR-based resin (manufactured by Japan Synthetic Rubber Corporation), but an example embodiment thereof is not limited thereto.

According to an example embodiment, to increase autofocus capability, the image sensor 1 including a pixel structure in which one microlens ML vertically overlaps a plurality of photodiodes PD may be provided. Accordingly, since the plurality of pixels PX may share a single microlens ML, the autofocus capability of the image sensor 1 may improve.

The image sensor 1 may include an isolation structure 215 including an isolation portion 215a surrounding the plurality of pixels PX and extension portions 215b extending to a region between the plurality of pixels PX and spaced apart from each other. Here, the plurality of pixels PX may be replaced with the photodiodes PD or the substrate pixel regions G1-G4, B1-B4, and R1-R4 described with reference to FIGS. 3, 4A and 4B.

The center of the microlens ML (ML_C) may vertically overlap the intermediate substrate region CR'. The center of the one microlens ML (ML_C) may be the thickest in the microlens ML. As the extension portions 215b are spaced apart from each other, the center of the single microlens ML and the isolation structure 215 may not vertically overlap. Loss of light focused by the microlens ML by the isolation structure 215, for example, loss of light by the isolation pattern 213b of the isolation structure 215, may be reduced or prevented. Accordingly, since loss of light collected by the microlens ML may be reduced or prevented, performance of the image sensor 1 may improve.

In an example embodiment, each of the extension portions 215b may include a width reduction region of which a width decreases in a direction away from the isolation portion 215a. Since the isolation structure 215 includes the extension portions 215b including a width reduction region, loss of light, collected by the microlens ML, by the extension portions 215b of the isolation structure 215 may be reduced.

In the description below, various modified examples of the elements of the above-described image sensor 1 will be described. Various modified examples of the elements of the image sensor 1 to be described below will be mainly described with respect to the elements to be modified or the elements to be replaced. Also, the elements which may be modified or replaced below are described with reference to each drawing, but the elements which may be modified or replaced may be combined with each other and may be included in the image sensor 1.

Figure 5:
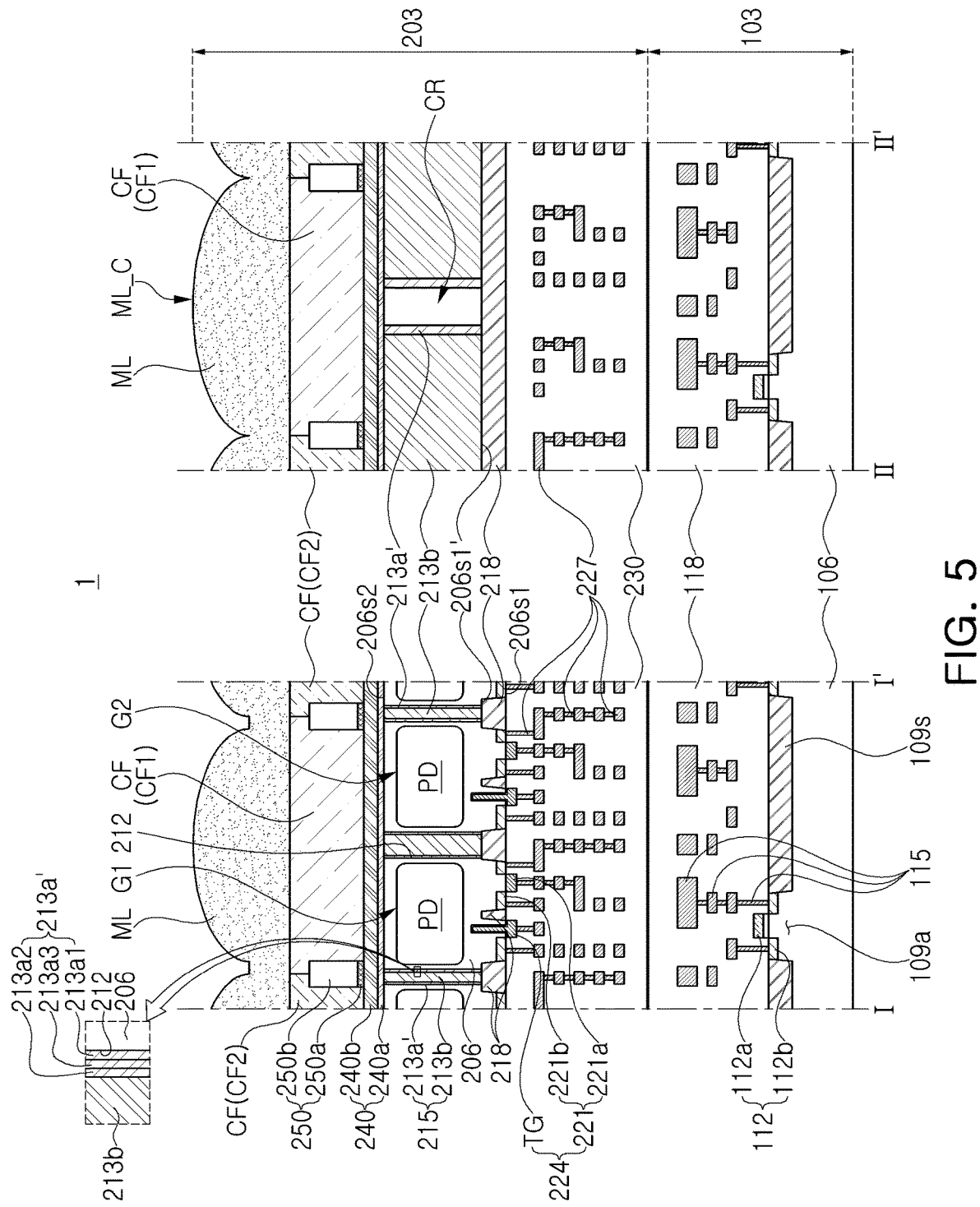
FIG. 5 is a cross-sectional diagram illustrating a modified example of an image sensor according to an example embodiment of the disclosure.

According to another example embodiment, the above-described isolation insulating layer 213a (in FIGS. 4A and 4B) will be described with reference to FIG. 5. FIG. 5 is a cross-sectional diagram taken along lines I-I' and II-II' in FIG. 4A, illustrating another example embodiment of the isolation insulating layer 213a in FIGS. 4A and 4B.

According to another example embodiment, referring to FIG. 5, the isolation insulating layer 213a (in FIGS. 4A and 4B), which may be formed as a single material layer as described above, may be modified to be an isolation insulating layer 213a' (in FIG. 5) including a plurality of layers stacked in sequence. For example, the plurality of layers of the isolation insulating layer 213a' may include a first layer 213a1 in contact with the second substrate 206, a second layer 213a2 in contact with the isolation pattern 213b, and a third layer 213a3 provided between the first layer 213a1 and the second layer 213a2.

The third layer 213a3 may include a material different from that of the first and second layers 213a1 and 213a2. For example, the first and second layers 213a1 and 213a2 may include an oxide, and the third layer 213a3 may include a nitride. For example, the first layer 213a1 may be a silicon oxide layer, the third layer 213a3 may be a silicon nitride layer, and the second layer 213a2 may be a silicon oxide layer. As such, by forming the isolation insulating layer 213a' as a plurality of material layers, performance of the image sensor 1 may improve.

In the description below, various modified examples of the cross-sectional structure of the isolation structure 215 in FIG. 4B will be described with reference to FIGS. 6A, 6B, 6C, 6D, 6E, 6F, and 6G. FIGS. 6A, 6B, 6C, 6D, 6E, 6F, and 6G are cross-sectional diagrams illustrating modified examples of an image sensor according to other example embodiments, illustrating regions taken along lines I-I' and II-II' in FIG. 4A. Hereinafter, variously modified isolation structures described with reference to FIGS. 6A, 6B, 6C, 6D, 6E, 6F, and 6G may have a shape as in FIGS. 3 and 4A unless otherwise indicated.

Figure 6A:
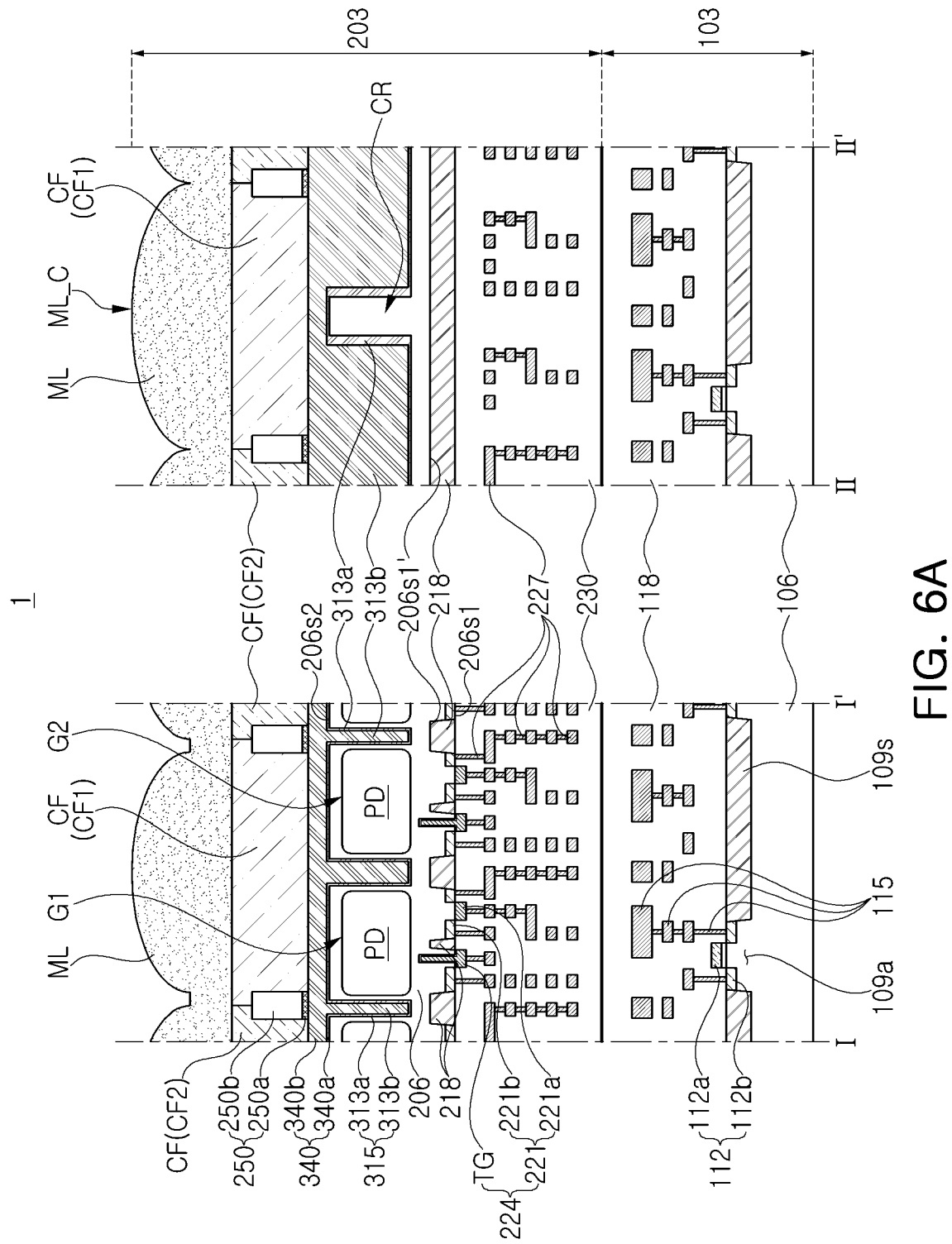
FIG. 6A is a cross-sectional diagram illustrating a modified example of an image sensor according to an example embodiment of the disclosure.

According to another example embodiment, referring to FIG. 6A, the above-described isolation structure 215 (in FIG. 4B) may be replaced with an isolation structure 315 extending from the second surface 206s2 of the second substrate 206 toward the first surface 206s1 of the second substrate 206. The isolation structure 315 may be spaced apart from the first surface 206s1 of the substrate 206. The isolation structure 315 may be spaced apart from the device isolation layer 218. For example, the substrate 206 may be provided in between the isolation structure 315 and the first surface 206s1. In another example, the substrate 206 may be provided in between the isolation structure 315 and the device isolation layer 218. However, the disclosure is not limited thereto.

The above-described insulating structure 240 (in FIG. 4B) may be modified to be an insulating structure 340 including substantially the same material as that of the isolation structure 315. For example, the insulating structure 340 may include a lower layer 340a and an upper layer 340b on the lower layer 340a, and at least a portion of the lower layer 340a and the upper layer 340b may extend into the second substrate 206 and may form a material of the isolation structure 315. For example, the isolation structure 315 may include a first layer 313a extending from the lower layer 340a and a second layer 313b extending from the upper layer 340b. The first layer 313a may be interposed between the second layer 313b and the second substrate 206. Accordingly, at least a portion of the isolation structure 315 may extend from at least a portion of the insulating structure 340, that is, the anti-reflection layer.

The lower layer 340a may include substantially the same material as that of the lower layer 240a (in FIG. 4B) described above, and the upper layer 340b may include substantially the same material as that of the upper layer 240a (in FIG. 4B) described above.

Figure 6B:
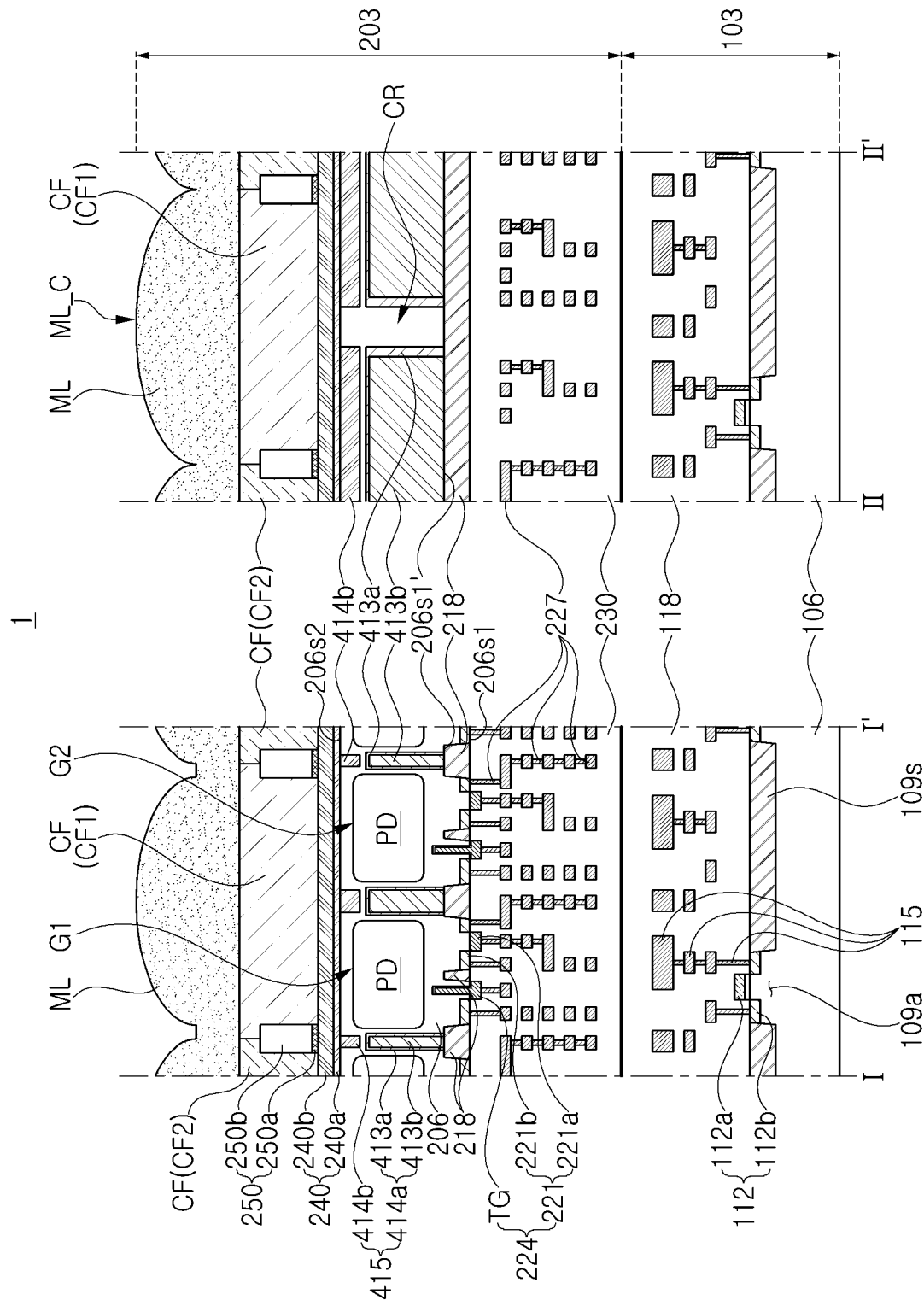
FIG. 6B is a cross-sectional diagram illustrating another modified example of an image sensor according to an example embodiment of the disclosure.

According to another example embodiment, referring to FIG. 6B, the above-described isolation structure 215 (in FIG. 4B) may include an isolation structure 415 including a lower isolation region 414a and an upper isolation region 414b on the lower isolation region 414a.

The lower isolation region 414a may extend from the first surface 206s1' of the second substrate 206 toward the second surface 206s2 of the second substrate 206, and the upper isolation region 414b may extend from the second surface 206s2 of the second substrate 206 toward the first surface 206s1' of the second substrate 206.

The lower isolation region 414a may include a lower isolation pattern 413b and a lower isolation insulating layer 413a provided between the lower isolation pattern 413b and the second substrate 206. The lower isolation pattern 413b may be formed of polysilicon, and the lower isolation insulating layer 413a may be formed of silicon oxide. The upper isolation region 414b may be formed of an insulating material. For example, the upper isolation region 414b may include at least one of silicon oxide and a high dielectric. At least a portion of the upper isolation region 414b may extend from at least a portion of the insulating structure 240.

The lower isolation region 414a may improve dark current properties of the image sensor 1, and the upper isolation region 414b may prevent cross talk of the image sensor 1. Accordingly, the isolation structure 415 may improve signal noise of the image sensor 1 and may increase resolution of the image sensor 1.

In the isolation structure 415, the lower isolation region 414a and the upper isolation region 414b may be spaced apart from each other. For example, the second substrate may be provided in between the lower isolation region 414a and the upper isolation region 414b. However, the disclosure is not limited thereto.

In the isolation structure 415, the planar shape of the lower isolation region 414a and the upper isolation region 414b may be substantially the same as the planar shape of the isolation structure 215 in FIG. 4A.

Figure 6C:
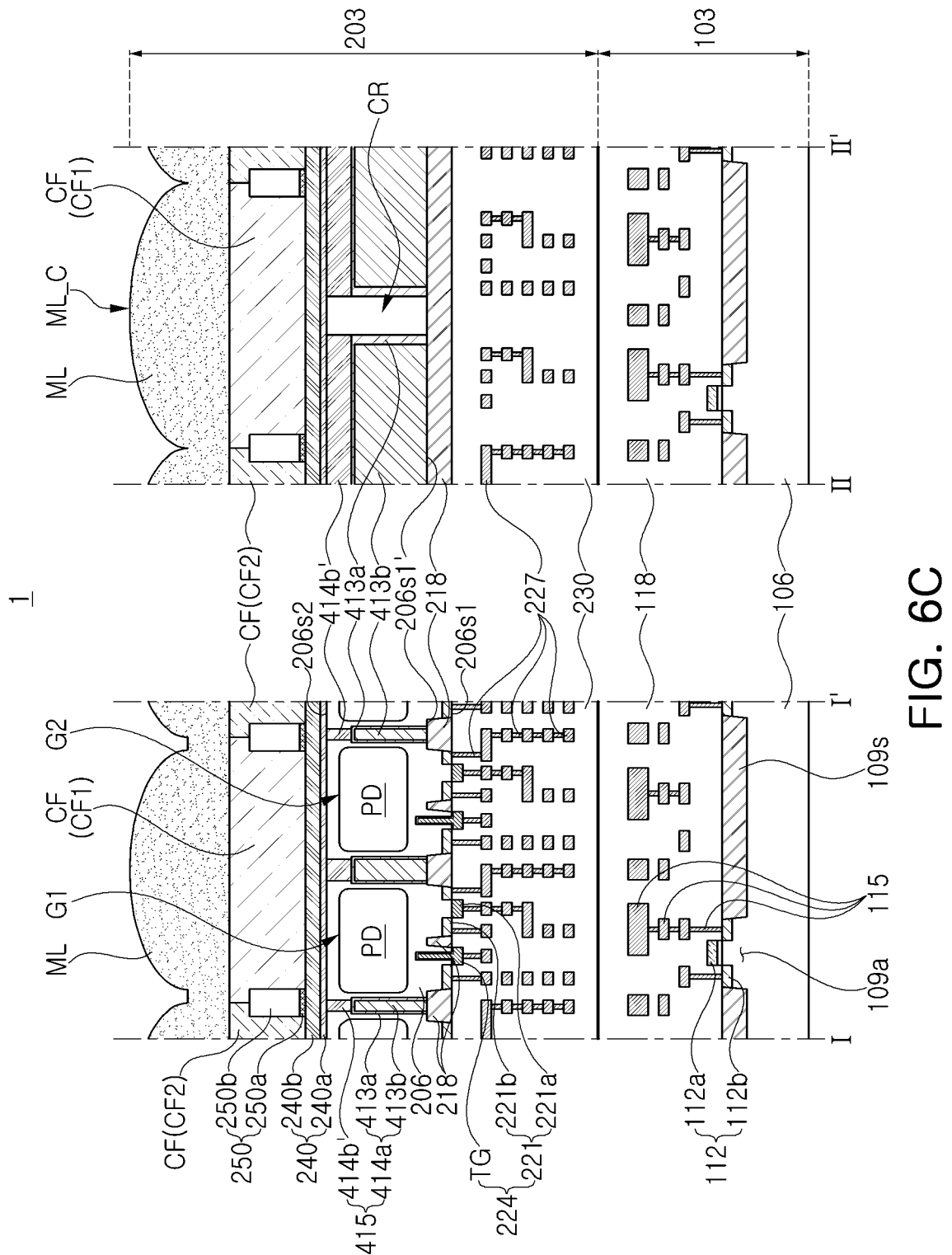
FIG. 6C is a cross-sectional diagram illustrating another modified example of an image sensor according to an example embodiment of the disclosure.

According to another example embodiment, referring to FIG. 6C, the upper isolation region 414b (in FIG. 6B) described with reference to FIG. 6B may be modified to be an upper isolation region 414b' in contact with the lower isolation region 414a described with reference to FIG. 6B. Accordingly, the image sensor 1 may include an isolation structure 415 including the lower isolation region 414a and the upper isolation region 414b' in contact with each other.

Figure 6D:
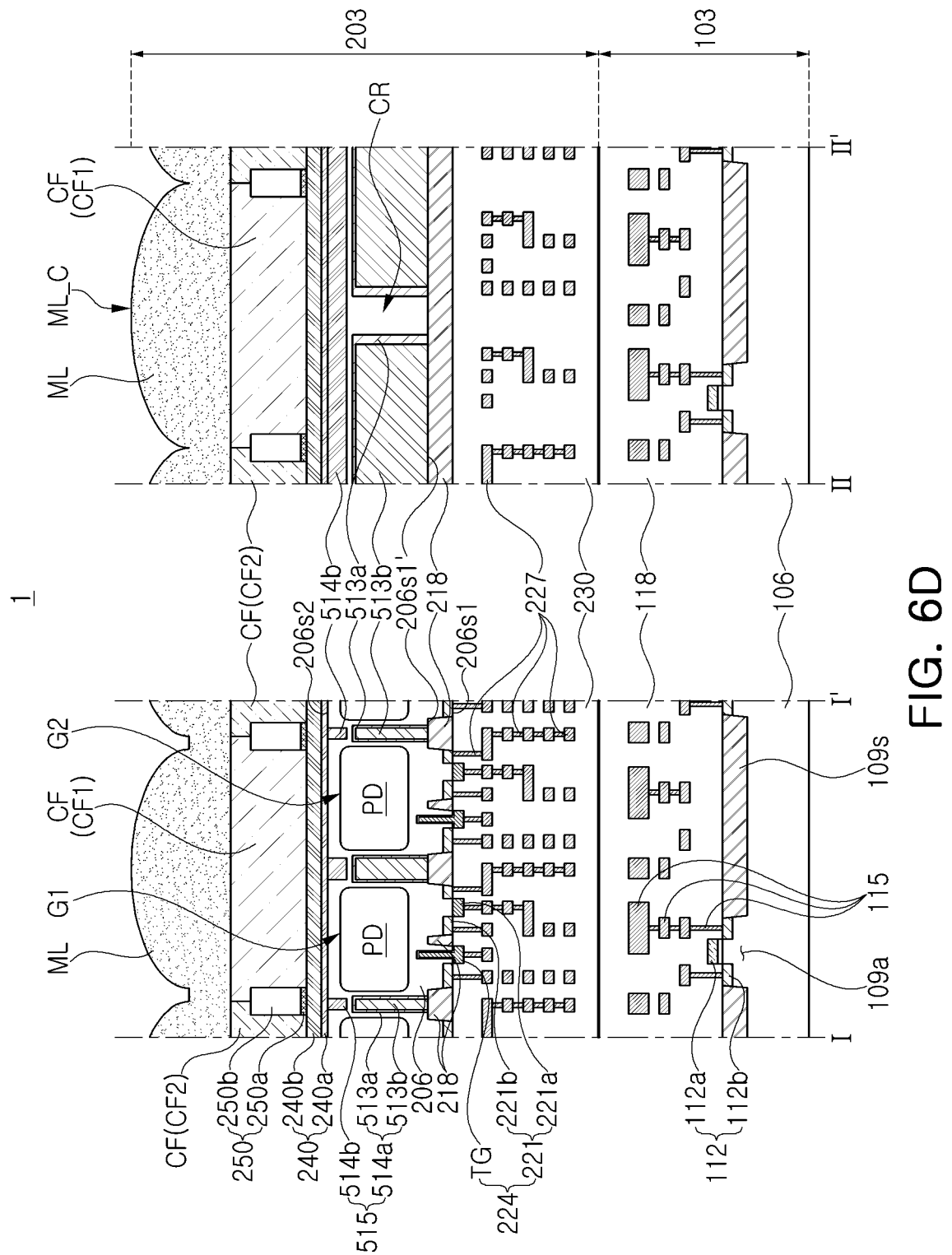
FIG. 6D is a cross-sectional diagram illustrating another modified example of an image sensor according to an example embodiment of the disclosure.

According to another example embodiment, referring to FIG. 6D, the isolation structure described above 215 (in FIG. 4B) may be modified to be an isolation structure 515 including a lower isolation region 514a and an upper isolation region 514b on the lower isolation region 514a. The lower isolation region 514a may extend from the first surface 206s1' of the second substrate 206 toward the second surface 206s2 of the second substrate 206, and the upper isolation region 514b may extend from the second surface 206s2 of the second substrate 206 toward the first surface 206s1' of the second substrate 206. The lower isolation region 514a may include a lower isolation pattern 513b and a lower isolation insulating layer 513a provided between the lower isolation pattern 513b and the second substrate 206. The lower isolation pattern 513b may be formed of poly-silicon, and the lower isolation insulating layer 513a may be formed of silicon oxide. The upper isolation region 514b may be formed of an insulating material. For example, the upper isolation region 514b may include at least one of silicon oxide and a high dielectric.

In the isolation structure 515, the lower isolation region 514a and the upper isolation region 514b may be spaced apart from each other.

In the isolation structure 515, the planar shape of the lower isolation region 514a may be substantially the same as the planar shape of the isolation structure 215 in FIG. 4A, the planar shape of the upper isolation region 514b may overlap the isolation portion 215a (in FIG. 4A) in FIG. 4A, may extend from the area of overlap with the isolation portion 215a (in FIG. 4A) to a region between the first to fourth pixel substrate regions G1, G2, G3, and G4, and may overlap the intermediate substrate region CR. Accordingly, the upper isolation region 514b may vertically overlap the lower isolation region 514a and the intermediate substrate region CR. The upper isolation region 514b vertically overlapping the intermediate substrate region CR may be formed of an insulating material.

Figure 6E:
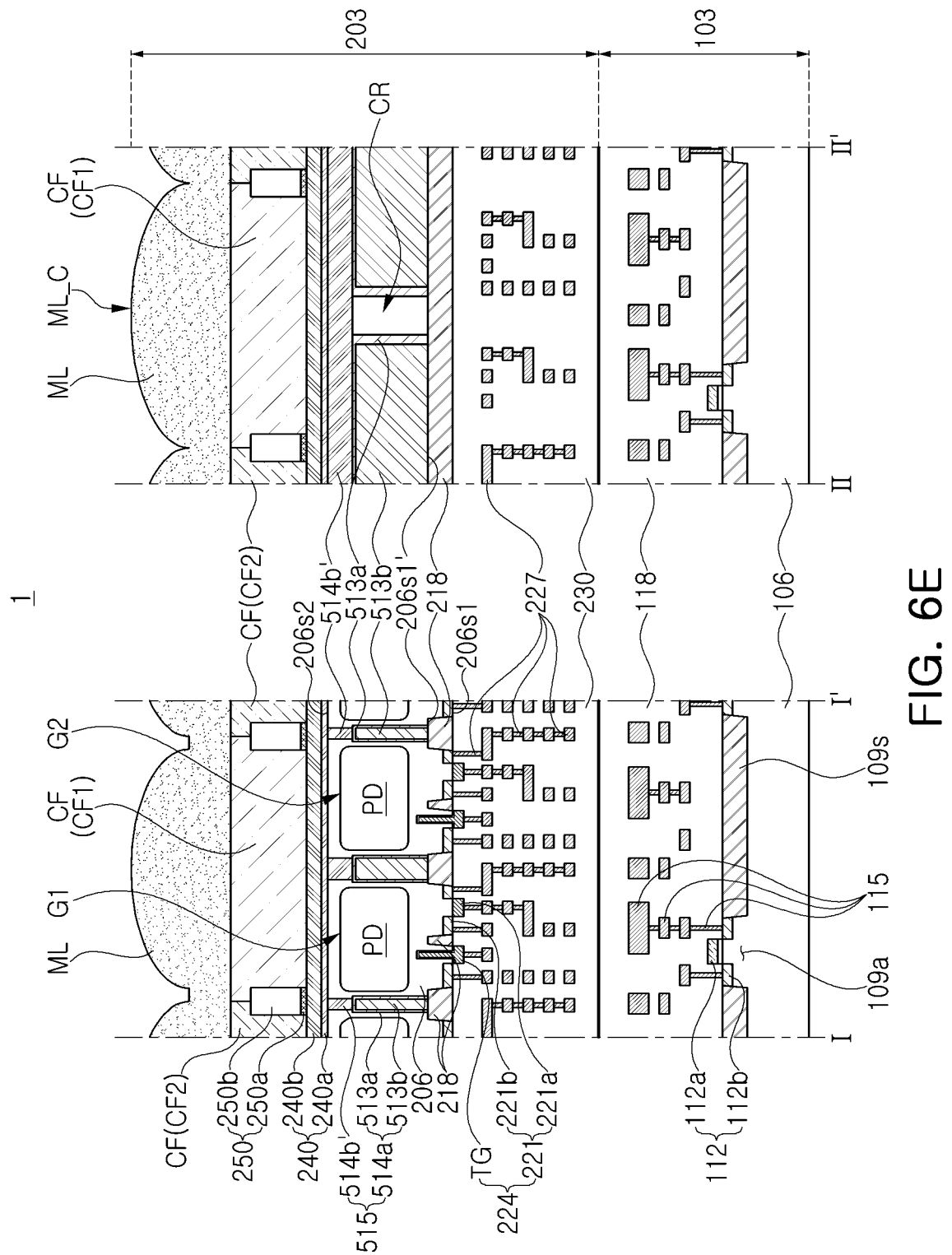
FIG. 6E is a cross-sectional diagram illustrating another modified example of an image sensor according to an example embodiment of the disclosure.

According to another example embodiment, referring to FIG. 6E, the upper isolation region 514b (in FIG. 6D) described with reference to FIG. 6D may be modified to be an upper isolation region 514b' in contact with the lower isolation region 514a described with reference to FIG. 6D. Accordingly, the image sensor 1 may include an isolation structure 515 including the lower isolation region 414a and the upper isolation region 414b' in contact with each other.

Figure 6F:
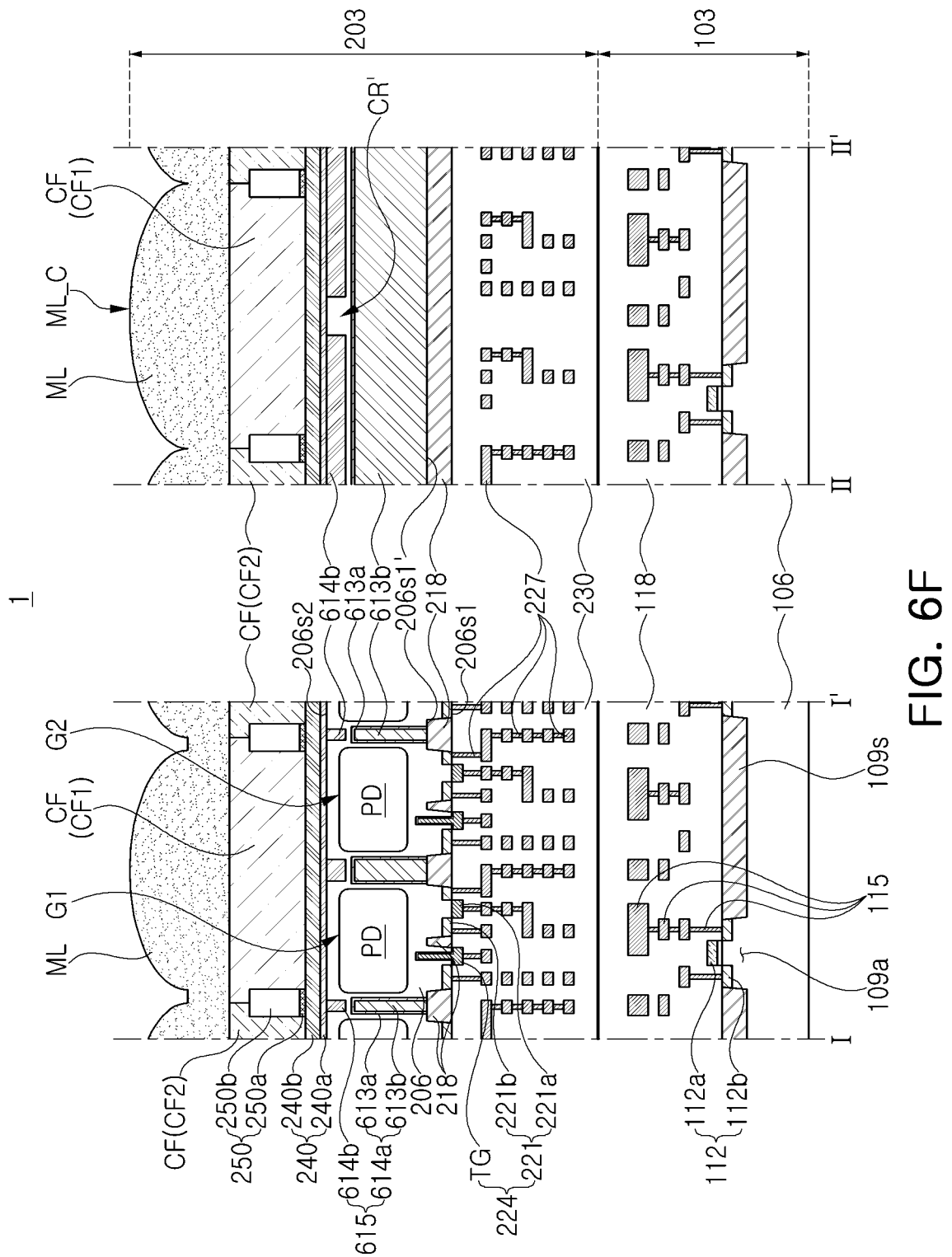
FIG. 6F is a cross-sectional diagram illustrating another modified example of an image sensor according to an example embodiment of the disclosure.

According to another example embodiment, referring to FIG. 6F, the upper isolation region 514b in FIG. 6D described with reference to FIG. 6D may be modified to be an upper isolation region 614b having a planar shape substantially the same as the planar shape of the isolation structure 215 (in FIG. 4A) in FIG. 4A, and the lower isolation region 514a (in FIG. 6D) described with reference to FIG. 6D may be modified to be a lower isolation region 614a having substantially the same planar shape as that of the upper isolation region 514b (in FIG. 6D) described with reference to FIG. 6D. Accordingly, the image sensor 1 may include an isolation structure 615 including the lower isolation region 614a and the upper isolation region 614b.

The lower isolation region 614a and the upper isolation region 614b may be spaced apart from each other. The lower isolation region 614a may extend from the first surface 206s1' of the second substrate 206 toward the second surface 206s2 of the second substrate 206, and the upper isolation region 614b may extend from the second surface 206s2 of the second substrate 206 toward the first surface 206s1' of the second substrate 206. The lower isolation region 614a may include a lower isolation pattern 613b and a lower isolation insulating layer 613a provided between the lower isolation pattern 613b and the second substrate 206. The lower isolation pattern 613b may be formed of polysilicon, and the lower isolation insulating layer 613a may be formed of silicon oxide. The upper isolation region 614b may be formed of an insulating material. For example, the upper isolation region 614b may include at least one of silicon oxide and a high dielectric.

Since the upper isolation region 614b may have substantially the same planar shape as the planar shape of the isolation structure 215 in FIG. 4A described with reference to FIG. 4A, the upper isolation region 614b may have line portions and extension portions corresponding to the line portions 215a (in FIG. 4A) and the extension portions 215b (in FIG. 4A), respectively, described with reference to FIG. 4A.

The intermediate substrate region CR described with reference to FIG. 4A may be modified to be an intermediate substrate region CR' provided in the second substrate 206 between end portions of the extension portions of the upper isolation region 614b. The lower isolation region 614a may be provided below the intermediate substrate region CR' and may vertically overlap the intermediate substrate region CR' of the substrate. An extension portion of the lower isolation region 614a vertically overlapping the intermediate substrate region CR' may include the polysilicon of the lower isolation pattern 613b.

Figure 6G:
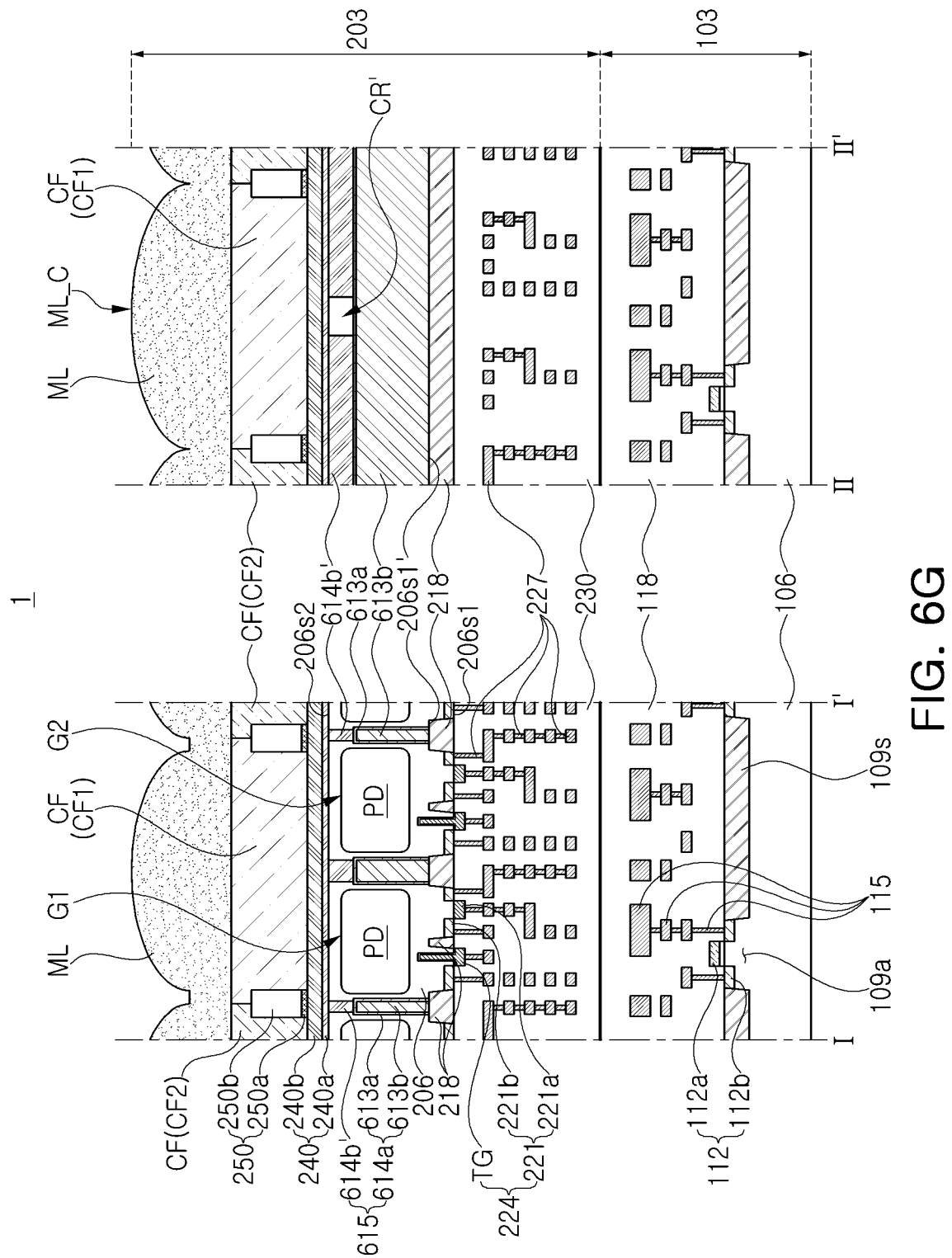
FIG. 6G is a cross-sectional diagram illustrating another modified example of an image sensor according to an example embodiment of the disclosure.

According to another example embodiment, referring to FIG. 6G, the upper isolation region 614b (in FIG. 6F) described with reference to FIG. 6F may be modified to be an upper isolation region 614b' in contact with the lower isolation region 614a described with reference to FIG. 6F. Accordingly, the image sensor 1 may include an isolation structure 615 including the lower isolation region 614a and the upper isolation region 614b' in contact with each other.

Figure 7:
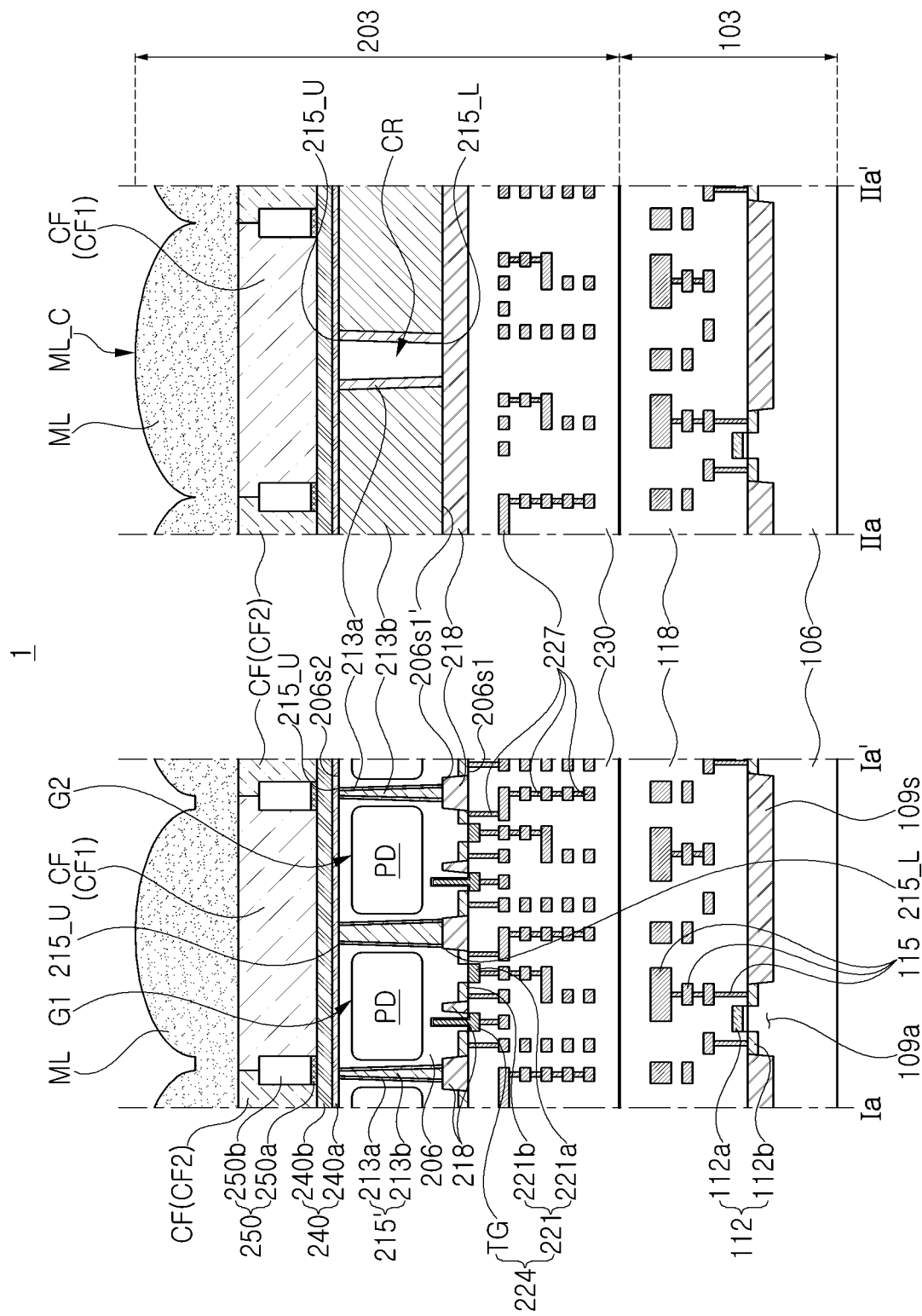
FIG. 7 is a cross-sectional diagram illustrating another modified example of an image sensor according to an example embodiment of the disclosure.

In the description below, a modified example of a side profile of the isolation structure 215 (in FIG. 4B) of the image sensor 1 will be described with reference to FIG. 7. FIG. 7 is a cross-sectional diagram taken along lines I-I' and II-II' in FIG. 4A.

According to another example embodiment, referring to FIG. 7, the isolation structure 215 described with reference to FIGS. 3, 4A, and 4B may be modified to be an isolation structure 215' having an inclined side surface. For example, the isolation structure 215' may have a first width on the upper surface 215_U and a second width greater than the first width on the lower surface 215_L. In the cross-sectional structure, a width of an upper portion of the isolation structure 215' adjacent to the second surface 206s2 of the second substrate 206 may be less than a width of a lower portion adjacent to the first surface 206s1 of the second substrate 206. Accordingly, the isolation structure 215' may have a side inclined such that the width thereof may gradually increase from the upper portion to the lower part. In the intermediate substrate region CR of the second substrate 206 provided between the extension portions 215b of the isolation structure 215', a width of the lower portion adjacent to the first surface 206s1 of the second substrate 206 may be less than the width of the upper portion adjacent to the second surface 206s2 of the second substrate 206.

In an example embodiment, in the cross-sectional structure, since the isolation structure 215' may have side inclined such that the width of the upper portion adjacent to the second surface 206s2 of the second substrate 206 may be less than the width of the lower portion adjacent to the second surface 206s1 of the second substrate 206, the loss of light, collected by the microlens ML, by the isolation structure 215' may be reduced.

In the description below, various modified examples of the isolation structure 215 in FIG. 4A will be described with reference to FIGS. 8A, 8B, 8C, 8D, 8E, 8F, 8G, 8H and 8I. FIGS. 8A, 8B, 8C, 8D, 8E, 8F, 8G, 8H, and 8I are diagrams illustrating modified examples of an image sensor according to an example embodiment, illustrating a modified planar shape of the isolation structure 215 in FIG. 4A. Accordingly, the modified isolation structures described with reference to FIGS. 8A, 8B, 8C, 8D, 8E, 8F, 8G, 8H, and 8I may include the isolation pattern 213b and the isolation insulating layer 213a as in FIG. 4A. Also, the modified isolation structures described with reference to FIGS. 8A, 8B, 8C, 8D, 8E, 8F, 8G, 8H, and 8I may have the cross-sectional structure as in FIG. 4B and also one of the cross-sectional structures in FIGS. 6A, 6B, 6C, 6D, 6F, 6G, and 7.

Figure 8A:
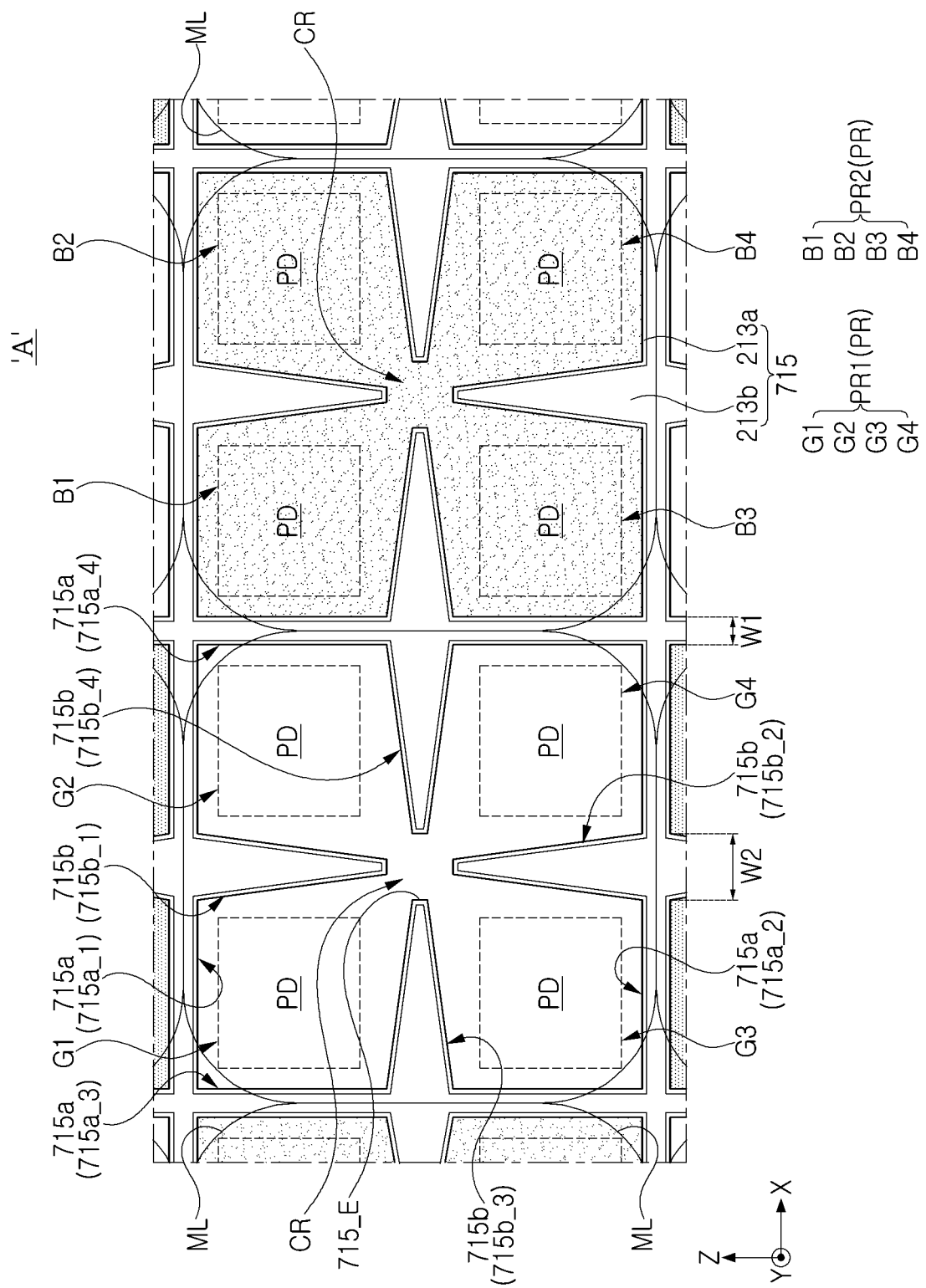
FIG. 8A is a diagram illustrating another modified example of an image sensor according to an example embodiment of the disclosure, viewed from the above.

According to another example embodiment, referring to FIG. 8A, the isolation structure 215 (in FIG. 4A) including the extension portions 215B (in FIG. 4A) having a pointed end portion 215_E (in FIG. 4A) in FIG. 4A may be replaced with an isolation structure 715 including extension portions 715b having a flat end portion 715_E. For example, the isolation structure 715 may include an isolation portion 715a surrounding each of the groups PR, and extension portions 715b extending from the isolation portion 715a to each region between the plurality of pixel substrate regions G1, G2, G3, G4, B1, B2, B3, B4, R1, R2, R3, and R4 in FIG. 3.

The isolation portion 715a may include first to fourth line portions 715a_1, 715a_2, 715a_3, and 715a_4 corresponding to the first to fourth line portions 215a_1, 215a_2, 215a_3, 215a_4 of the isolation portion 215 in FIG. 4A.

The extension portions 715b may include first to fourth extension portions 715b_1, 715b_2, 715b_3, and 715b_4 extending from the isolation portion 715a and provided in positions corresponding to the first to fourth extension portions 215b_1, 215b_2, 215b_3, 215b_4 (in FIG. 4A) in FIG. 4A, respectively.

The extension portions 715b may have flat end portions 715_E. For example, the first and second extension portions 715b_1 and 715b_2 opposing each other may have end portions 715_E parallel to each other, and the third and fourth extension portions 715b_3 and 715b_4 opposing each other may have end portions 715_E parallel to each other.

In each of the extension portions 715b, a minimum width may be about 0.8 times a maximum width, or less than about 0.8 times the maximum width.

Figure 8B:
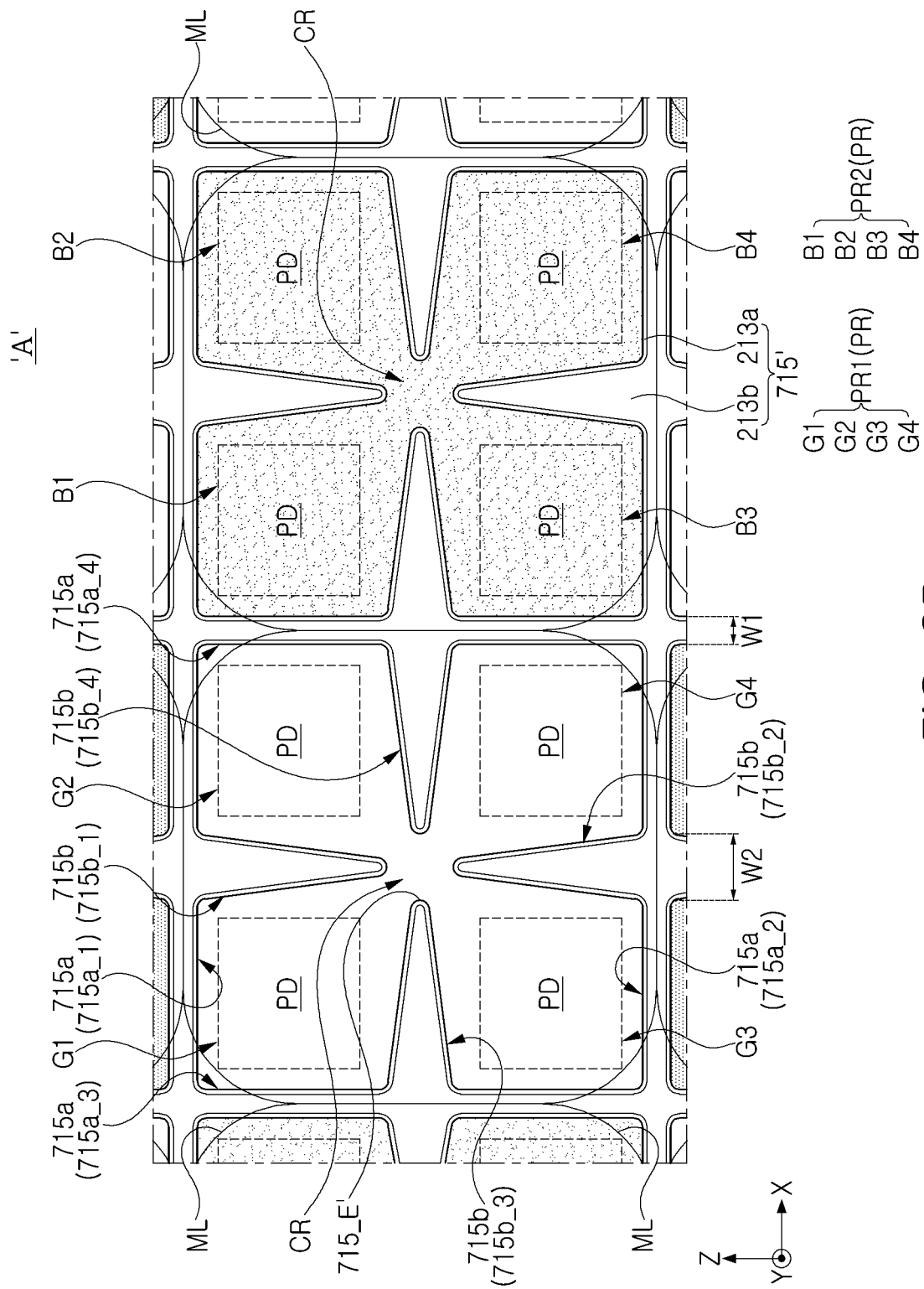
FIG. 8B is a diagram illustrating another modified example of an image sensor according to an example embodiment of the disclosure, viewed from the above.

According to another example embodiment, referring to FIG. 8B, in the extension portions 715b in FIG. 8A, the flat end portions 715_E may be modified to be rounded end portions 715_E'. The isolation structure 715 in FIG. 8A (in FIG. 8A) may be modified to be an isolation structure 715' including the extension portions 715b having rounded end portions 715_E'.

Figure 8C:
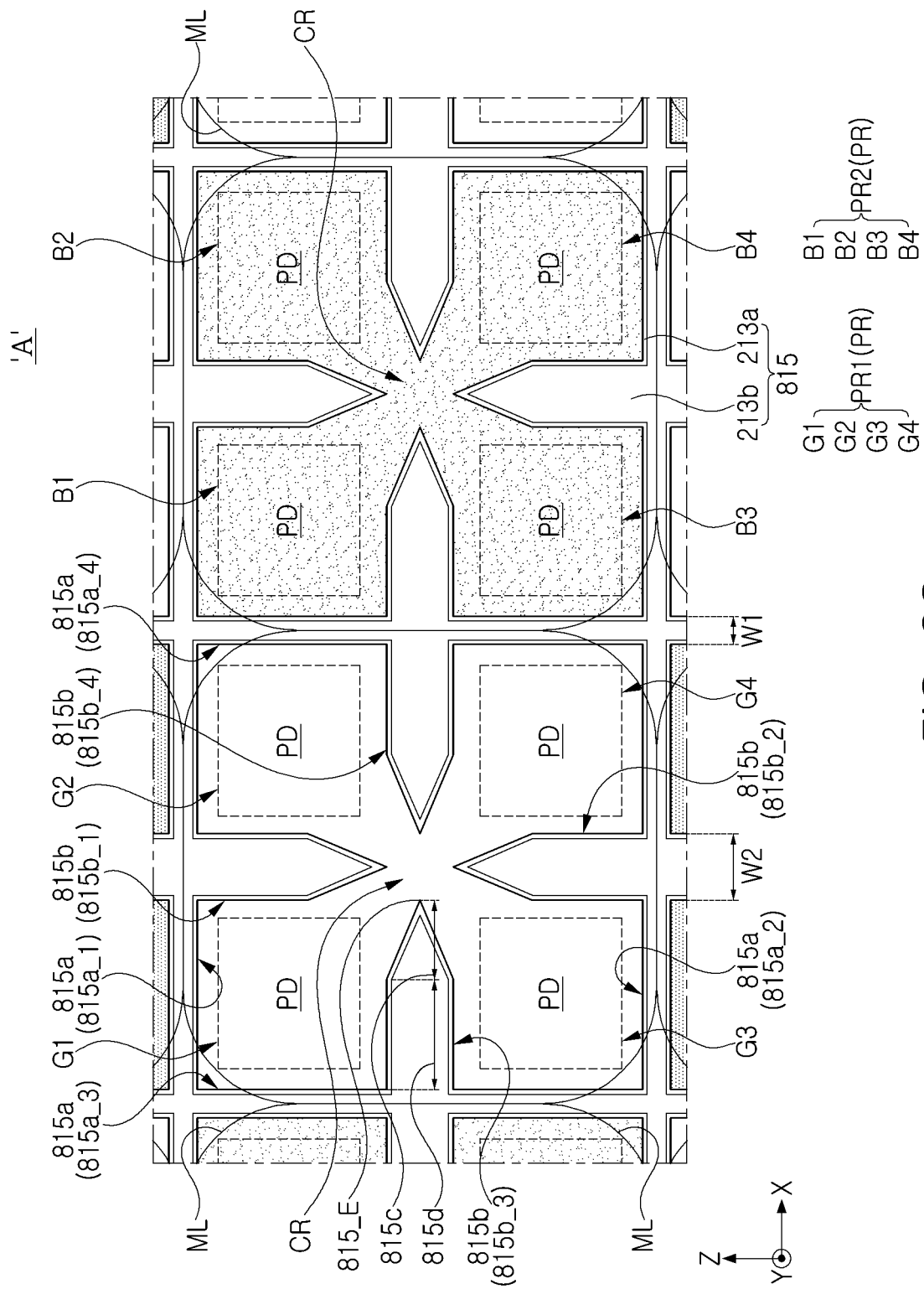
FIG. 8C is a diagram illustrating another modified example of an image sensor according to an example embodiment of the disclosure, viewed from the above.

According to another example embodiment, referring to FIG. 8C, the isolation structure 215 (in FIG. 4A) in FIG. 4A may be modified to be the isolation structure 815 as in FIG. 8C. As described with reference to FIGS. 3 and 4A, the isolation structure 815 may include an isolation portion 815a surrounding each of the groups PR, and extension portions 815b extending from the isolation portion 815a to regions between the pixel substrate regions G1, G2, G3, G4, B1, B2, B3, B4, R1, R2, R3, and R4 of each of the groups PR (in FIG. 3).

The isolation portion 815a may include first to fourth line portions 815a_1, 815a_2, 815a_3, and 815a_4 corresponding to the first to fourth line portions 215a_1, 215a_2, 215a_3, and 215a_4 in FIG. 4A, respectively.

The extension portions 815b may include first to fourth extension portions 815b_1, 815b_2, 815b_3, and 815b_4 extending from the isolation portion 815a and provided in positions corresponding to the first to fourth extension portions 215b_1, 215b_2, 215b_3, 215b_4 in FIG. 4A, respectively.

Each of the extension portions 815b may include a first region 815c and a second region 815d. In each of the extension portions 815b, the second region 815d may be provided between the first region 815c and the isolation portion 815a.

In each of the extension portions 815b, the second region 815d may extend from the isolation portion 815a and may have substantially the same width, and the first region 815c may extend from the second region 815d and a width of the first region 815c may gradually decrease. The first region 815c may be referred to as a width reduction region.

A maximum width of the first region 815c may be substantially the same as a width of the second region 815d.

A length of the first region 815c may be smaller than a length of the second region 815d.

A length of the first region 815c may be different from a width of the first region 815c. For example, the length of the first region 815c may be greater than the width of the first region 815c. According to another example embodiment, the length of the second region 815d may be same as the length of the first region 815c.

The extension portions 815b may have pointed end portions 815_E.

Figure 8D:
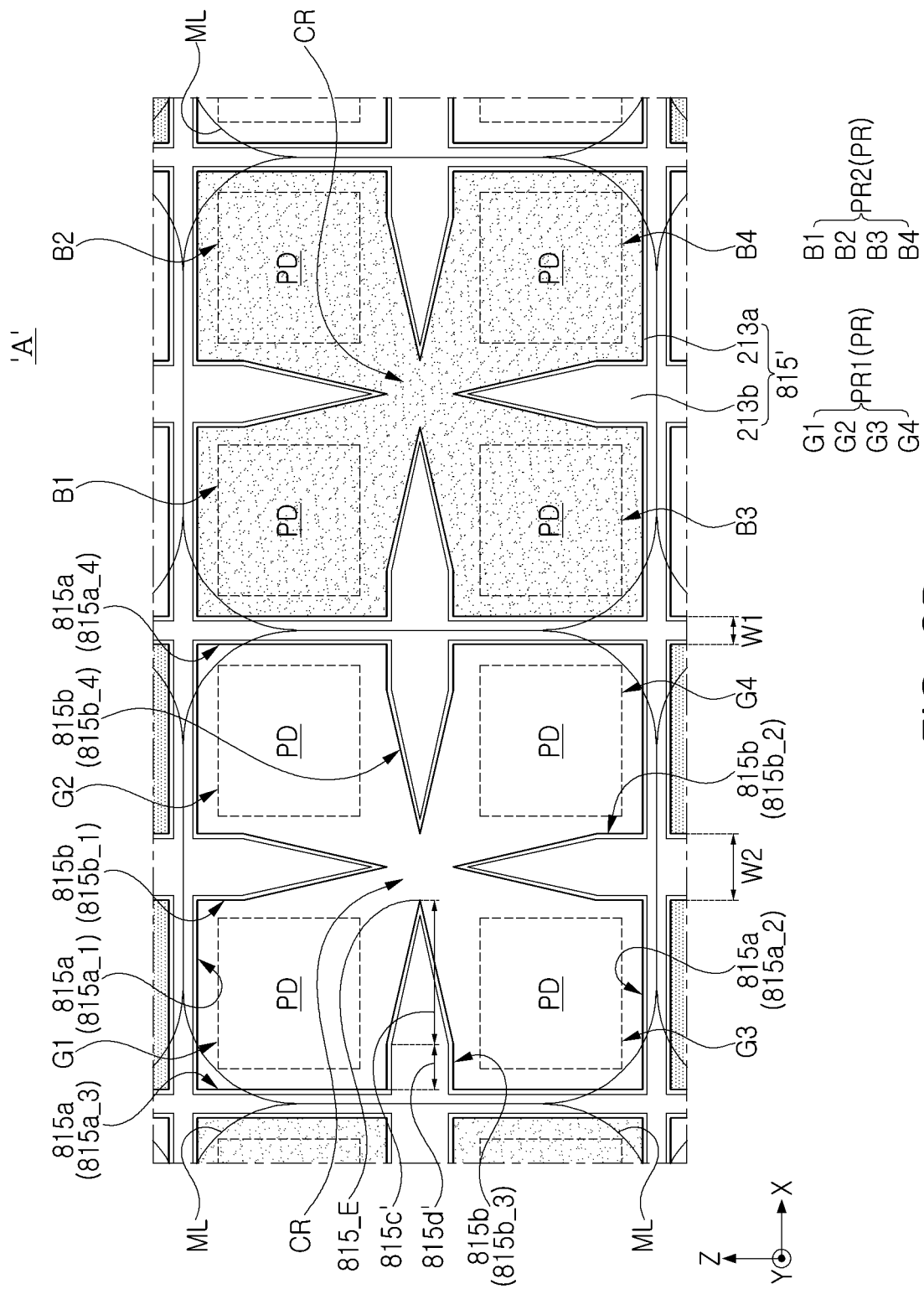
FIG. 8D is a diagram illustrating another modified example of an image sensor according to an example embodiment of the disclosure, viewed from the above.

According to another example embodiment, referring to FIG. 8D, in each of the extension portions 815b (in FIG. 8C) described with reference to FIG. 8C, the first region 815c may be modified to be a first region 815c' having a relatively long length, and the second region 815d may be modified to be a second region 815d' having a relatively short length. Accordingly, the length of the second region 815d' may be smaller than the length of the first region 815c'. Accordingly, the isolation structure 815 (in FIG. 8C) described with reference to FIG. 8C may be modified to be an isolation structure 815' including the first and second regions 815*c'* and 815*d'*.

Figure 8E:
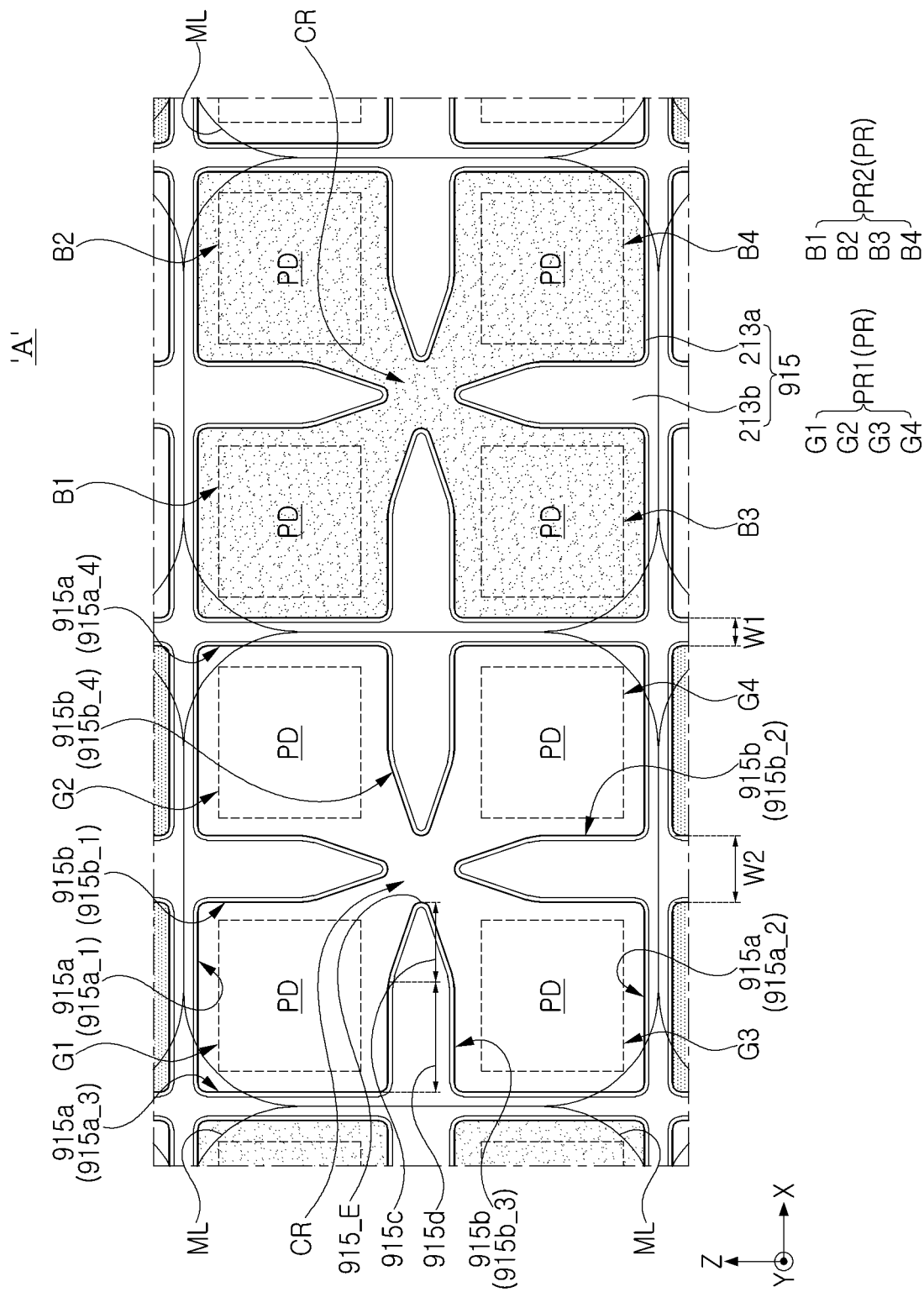
FIG. 8E is a diagram illustrating another modified example of an image sensor according to an example embodiment of the disclosure, viewed from the above.

According to another example embodiment, referring to FIG. 8E, the extension portions (815B in FIG. 8C) having the pointed end portions 815_E (in FIG. 8C) in FIG. 8C may be modified to be extension portions 915*b* having rounded end portions 915_E. Accordingly, the isolation structure 815 in FIG. 8C may be modified to be an isolation structure 915 including the extension portions 915*b* having end portions 915_E configured to be rounded. The isolation structure 915 may include an isolation portion 915*a* including the first to fourth line portions 915*a*_1, 915*a*_2, 915*a*_3, and 915*a*_4 and having substantially the same planar shape as that of the isolation portion 815*a* (in FIG. 8C) including the first to fourth line portions 815*a*_1, 815*a*_2, 815*a*_3, and 815*a*_4 (in FIG. 8C) described with reference to FIG. 8C.

In the isolation structure 915, each of the extension portions 915*b* may include a first region 915*c* and a second region 915*d*. In each of the extension portions 915*b*, the second region 915*d* may be provided between the first region 915*c* and the isolation portion 915*a*.

In each of the extension portions 815*b*, the second region 815*d* may extend from the isolation portion 915*a* and may have substantially the same width, and the first region 915*c* may extends from the second region 915*d*, a width of the first region 915*c* may gradually decrease, and the first region 915*c* may have the rounded end portion 915_E. The maximum width of the first region 915*c* may be substantially the same as the width of the second region 915*d*. A length of the first region 915*c* may be smaller than a length of the second region 915*d*. The length of the first region 915*c* may be different from the width of the first region 915*c*. For example, the length of the first region 915*c* may be greater than the width of the first region 915*c*.

Figure 8F:
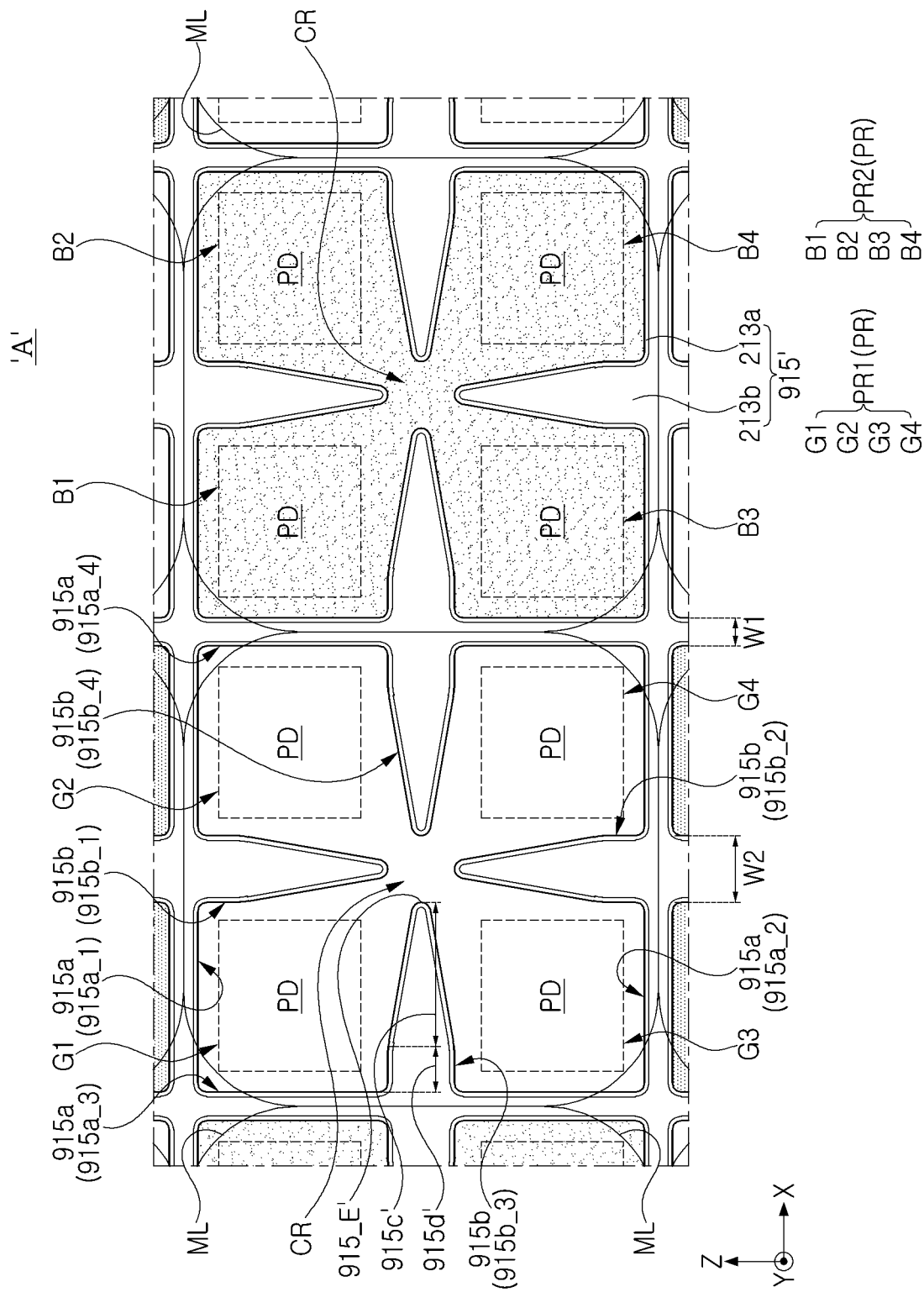
FIG. 8F is a diagram illustrating another modified example of an image sensor according to an example embodiment of the disclosure, viewed from the above.

According to another example embodiment, referring to FIG. 8F, in each of the extension portions 915*b* (in FIG. 8E) described with reference to FIG. 8E, the first region 915*c* may be modified to be a first region 915*c'* having a relatively long length, and the second region 915*d* may be modified to be a second region 915*d'* having a relatively short length. Accordingly, the length of the second region 915*d'* may be smaller than the length of the first region 915*c'*. Accordingly, the isolation structure 915 (in FIG. 8E) described with reference to FIG. 8E may be modified to be an isolation structure 915' including the first and second regions 915*c'* and 915*d'*.

Figure 8G:
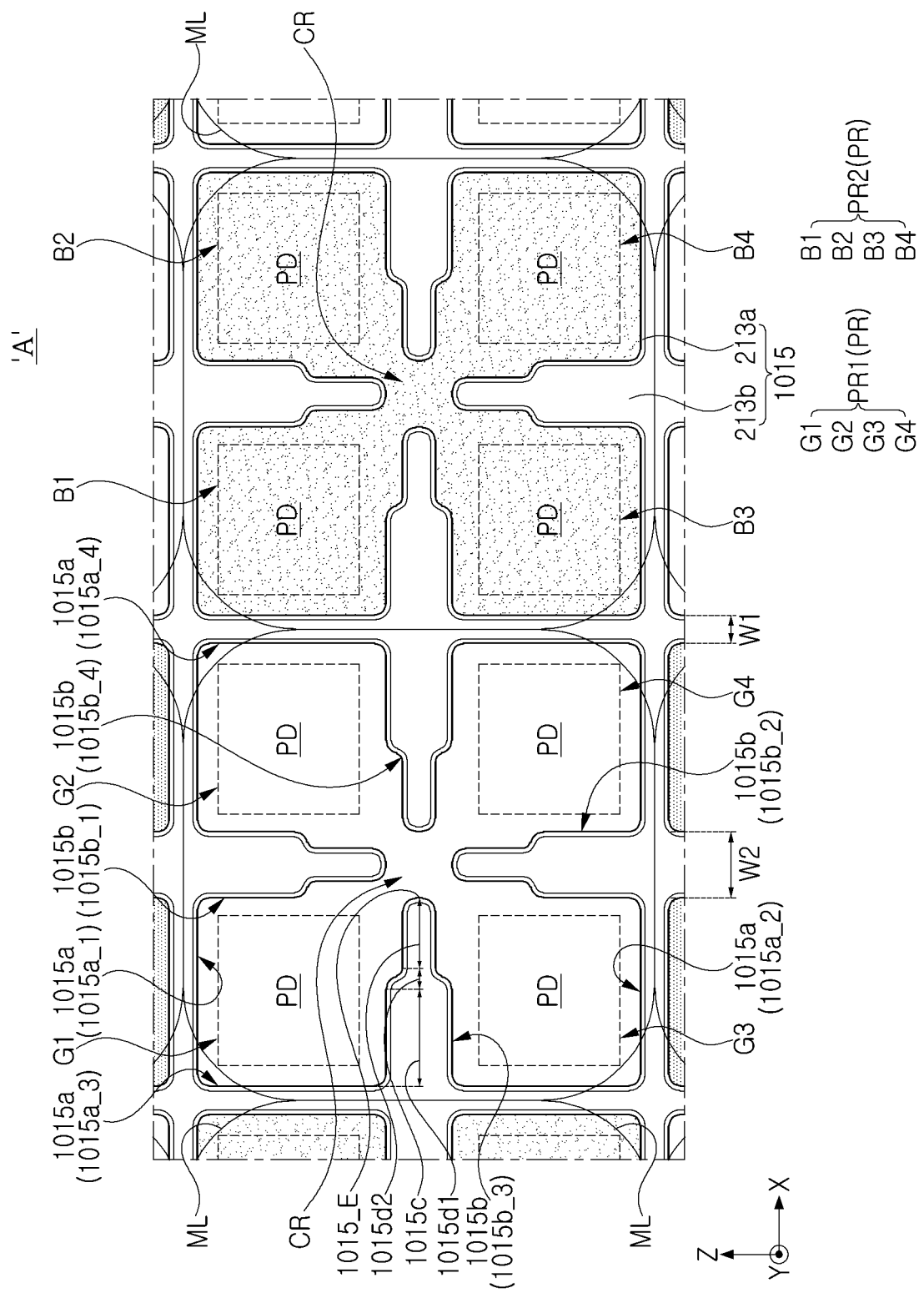
FIG. 8G is a diagram illustrating another modified example of an image sensor according to an example embodiment of the disclosure, viewed from the above.

According to another example embodiment, referring to FIG. 8G, the isolation structure 215 (in FIG. 4A) may be modified to be the isolation structure 1015 as in FIG. 8G. The isolation structure 1015 may include an isolation portion 1015*a* surrounding each of the groups PR and extension portions 1015*b* extending from the isolation portion 1015*a* to a region between the plurality of pixel substrate regions G1, G2, G3, G4, B1, B2, B3, B4, R1, R2, R3, and R4 (in FIG. 3), as described with reference to FIGS. 3 and 4A.

The isolation portion 1015*a* may include first to fourth line portions 1015*a*_1, 1015*a*_2, 1015*a*_3, and 1015*a*_4 corresponding to the first to fourth line portions 215*a*_1, 215*a*_2, 215*a*_3, and 215*a*_4 (in FIG. 4A), respectively.

The extension portions 1015*b* may include first to fourth extension portions 1015*b*_1, 1015*b*_2, 1015*b*_3, 1015*b*_4 extending from the isolation portion 1015*a*, provided in positions corresponding to the first to fourth extension portions 215*b*_1, 215*b*_2, 215*b*_3, 215*b*_4 (in FIG. 4A) in FIG. 4A, respectively, and first to fourth extension portions 1015*b*_1, 1015*b*_2, 1015*b*_3, 1015*b*_4 having a shape different from that of the first to fourth extension portions 215*b*_1, 215*b*_2, 215*b*_3, 215*b*_4 (in FIG. 4A).

The extension portions 1015*b* may have rounded end portions 1010_E.

Each of the extension portions 1015*b* may include a first region 1015*d*1, a second region 1015*c*, and a third region 1015*d*2 provided in sequence from the isolation portion 1015*a*. In each of the extension portions 1015*b*, the second region 1015*c* may be provided between the first region 1015*d*1 and the third region 1015*d*2, and the first region 1015*d*1 may be provided between the isolation portion 1015*a* and the second region 1015*c*.

The first region 1015*d*1 may have substantially the same first width. The third region 1015*d*2 may have substantially the same second width. The width of the second region 1015*c* may decrease in a direction from the first region 1015*d*1 toward the third region 1015*d*2. The first width of the first region 1015*d*1 may be greater than the second width of the third region 1015*d*2.

In an example embodiment, the second region 1015*c* may be referred to as a width reduction region. In this case, the third region 1015*d*2 may be referred to as a second region.

The maximum width of the second region 1015*c* may be substantially the same as the first width of the first region 1015*d*1, and the minimum width of the second region 1015*c* may be substantially the same as the second width of the third region 1015*d*2.

A length of the second region 1015*c* may be smaller than a length of the first region 1015*d*1.

A length of the second region 1015*c* may be smaller than a length of the third region 1015*d*2.

A length of the first region 1015*d*1 may be different from a length of the third region 1015*d*3. For example, the length of the first region 1015*d*1 may be greater than the length of the third region 1015*d*3. According to another example, the length of the first region 1015*d*1 may be the same as each of a length of the third region 1015*d*3 and a length of the second region 1015*c*.

Figure 8H:
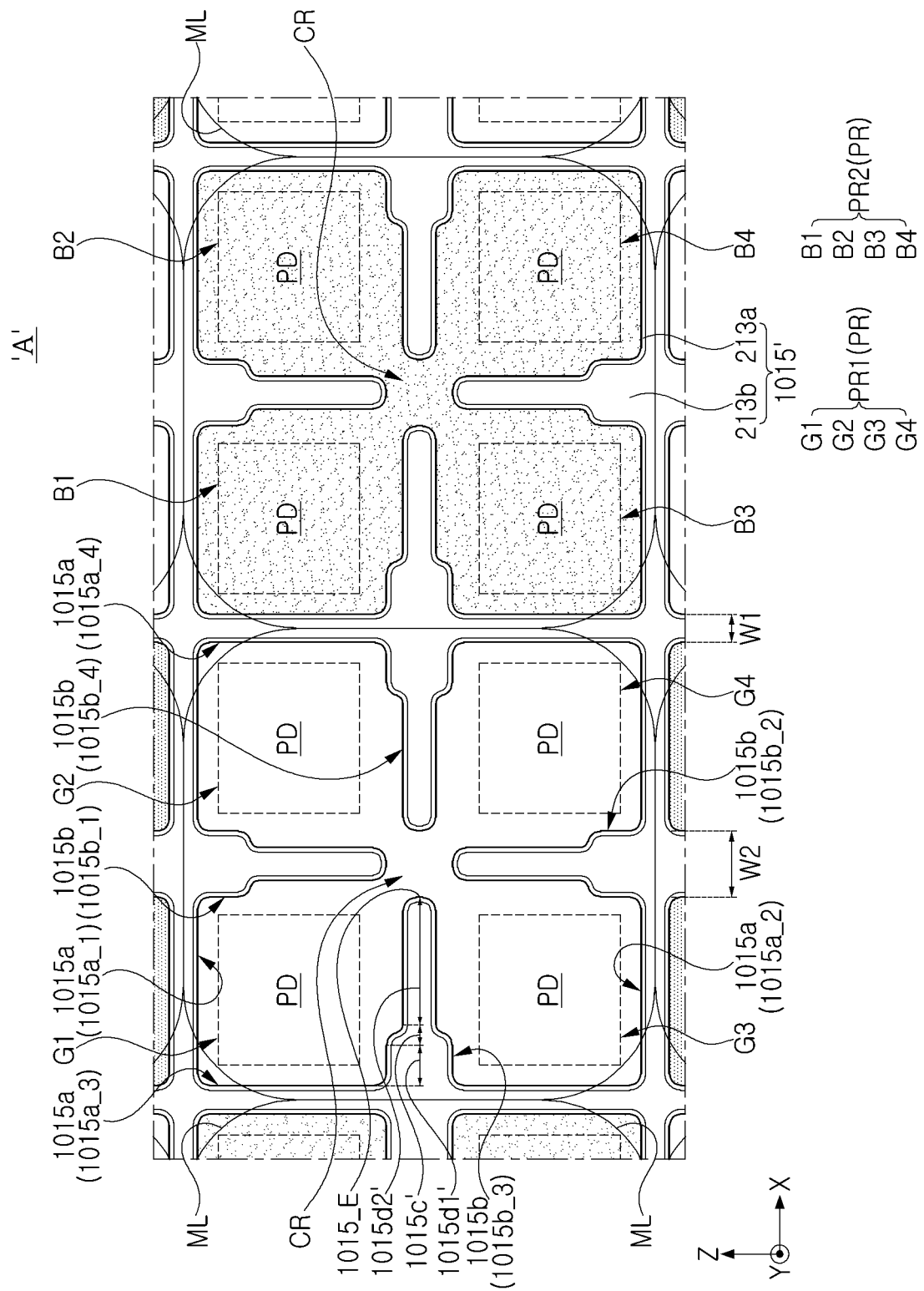
FIG. 8H is a diagram illustrating another modified example of an image sensor according to an example embodiment of the disclosure, viewed from the above.

According to another example embodiment, referring to FIG. 8H, in each of the extension portions 1015*b* (in FIG. 8G) described with reference to FIG. 8G, the first region 1015*d*1 (in FIG. 8G) may be modified to be a first region 1015*d*1' having a relatively short length, the third region 1015*d*2 (in FIG. 8G) may be modified to be a third region 1015*d*2' having a relatively long length, and the second region 1015*c* (in FIG. 8G) which may be a width reduction region may be modified to be a second region 1015*c'* provided between the first region 1015*d*1' and the third region 1015*d*2'.

Accordingly, the length of the third region 1015*d*2' may be greater than the length of the first region 1015*d*1'. Accordingly, the isolation structure 1015 (in FIG. 8H) described with reference to FIG. 8H may be modified to be an isolation structure 1015' including the first to third regions 1015*d*1', 1015*c'*, and 1015*d*2'.

Figure 8I:
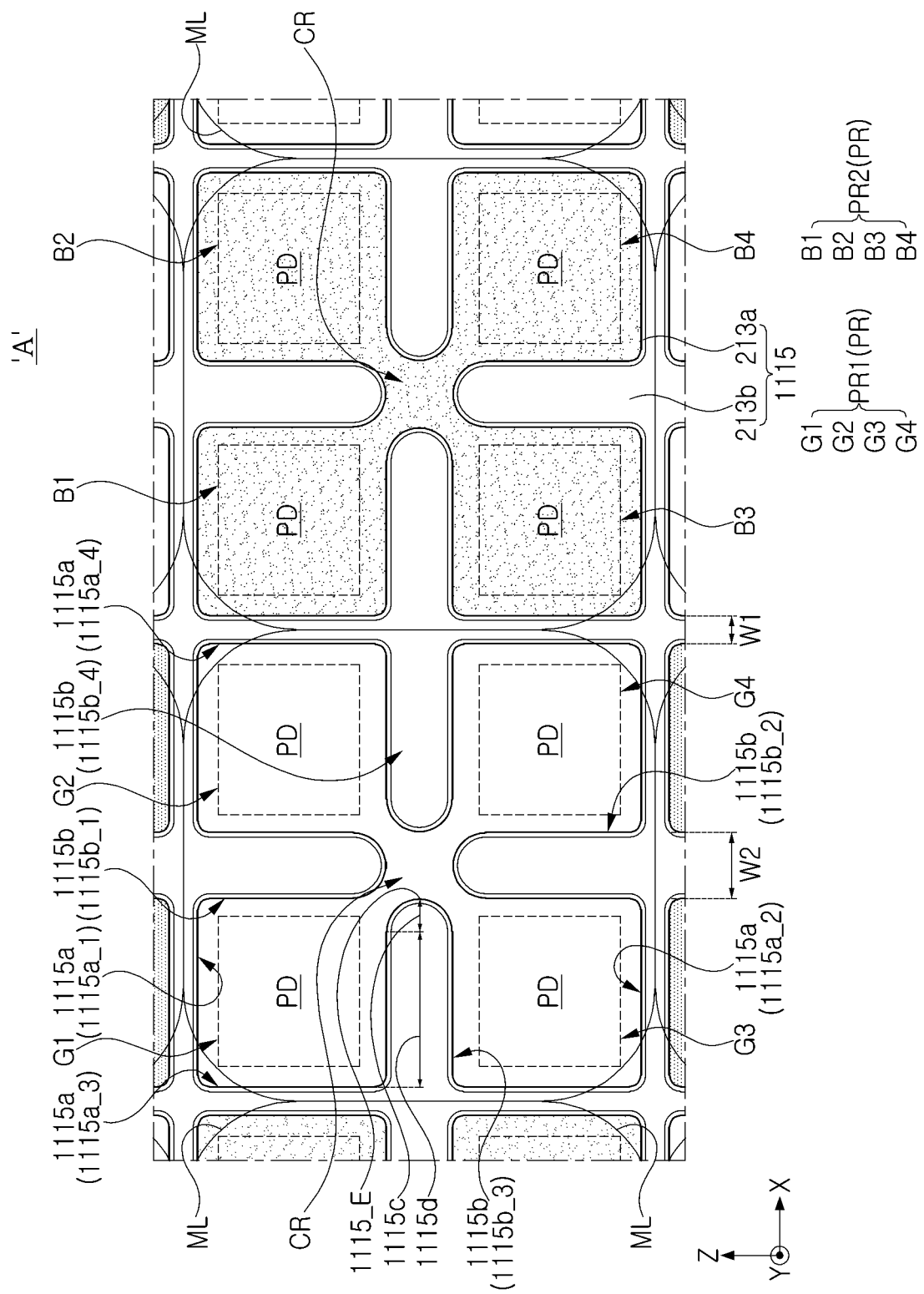
FIG. 8I is a diagram illustrating another modified example of an image sensor according to an example embodiment of the disclosure, viewed from the above.

According to another example embodiment, referring to FIG. 8I, the isolation structure 215 (in FIG. 4A) may be modified to be the isolation structure 1115 as in FIG. 8I. As described with reference to FIGS. 3 and 4A, the isolation structure 1115 may include an isolation portion 1115*a* surrounding each of the groups PR, and extension portions 1115*b* extending from the isolation portion 1115*a* to a region between the plurality of pixel substrate regions G1, G2, G3, G4, B1, B2, B3, B4, R1, R2, R3, and R4 (in FIG. 3) of each of the groups PR.

The isolation portion 1115*a* may include first to fourth line portions 1115*a*_1, 1115*a*_2, 1115*a*_3, 1115*a*_4 corresponding to the first to fourth line portions 215*a*_1, 215*a*_2, 215*a*_3, and 215*a*_4 in FIG. 4A, respectively.

The extension portions 1115*b* may include first to fourth extension portions 1115*b*_1, 1115*b*_2, 1115*b*_3, and 1115*b*_4 extending from the isolation portion 1115*a* and provided in positions corresponding to the first to fourth extension portions 215*b*_1, 215*b*_2, 215*b*_3, 215*b*_4 (in FIG. 4A) in FIG. 4A, respectively.

Each of the extension portions 1115*b* may include a first region 1115*c* and a second region 1115*d*. In each of the extension portions 1115*b*, the second region 1115*d* may be provided between the first region 1115*c* and the isolation portion 1115*a*.

In each of the extension portions 1115*b*, the second region 1115*d* may extend from the isolation portion 1115*a* and may have substantially the same width, and the first region 1115*c* may have a rounded shape in a direction away from the second region 1115*d* and a width thereof may gradually decrease. The first region 1115*c* may be referred to as a reduced width region.

A length of the first region 1115*c* may be smaller than a length of the second region 1115*d*. The length of the first region 1115*c* may be different from the maximum width of the first region 1115*c*. In an example embodiment, the length of the first region 1115*c* may be smaller than the maximum width of the first region 1115*c*. In another example embodiment, the length of the first region 1115*c* may be greater than the maximum width of the first region 1115*c*.

Figure 9:
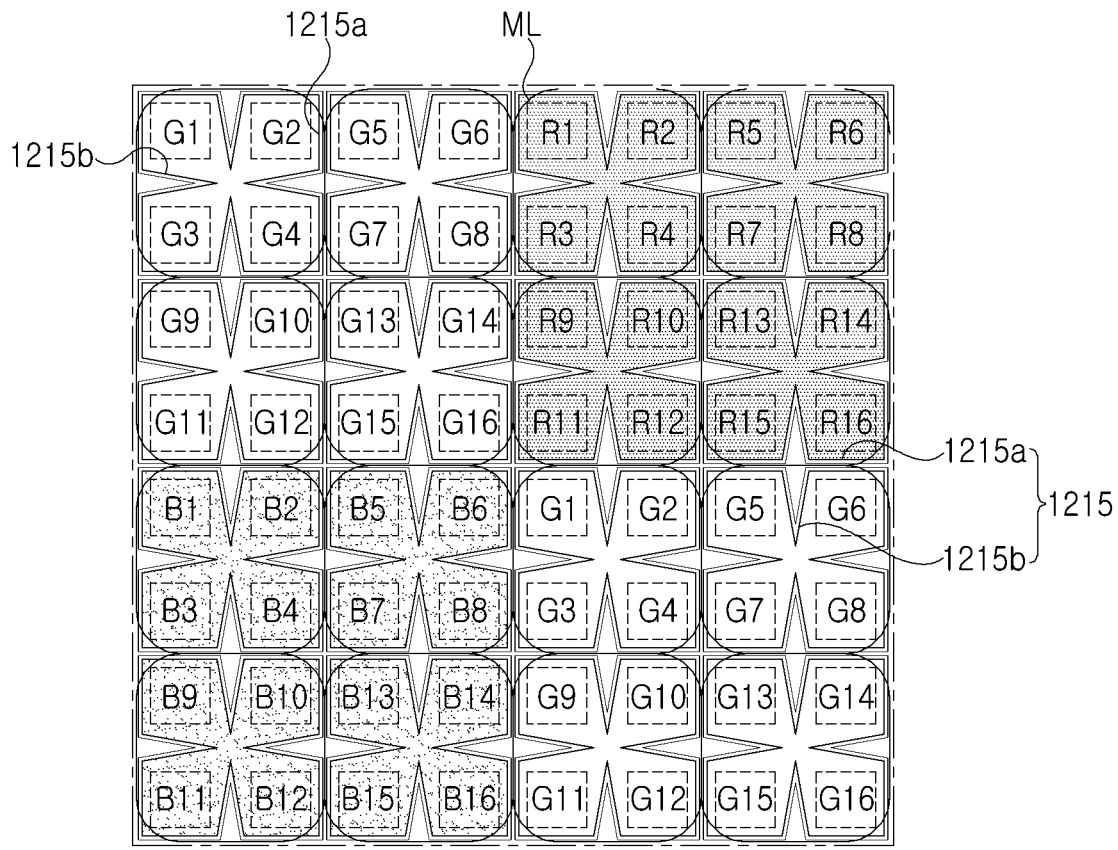
FIG. 9 is a diagram illustrating another modified example of an image sensor according to an example embodiment of the disclosure, viewed from the above.

In the description below, a modified example of the groups PR described with reference to FIG. 3 will be described with reference to FIG. 9. FIG. 9 is a diagram illustrating another modified example of an image sensor according to an example embodiment, viewed from the above.

According to another example embodiment, referring to FIG. 9, the plurality of groups PR may include first groups PR1*a*, PR1*b*, PR1*c*, and PR1*d* adjacent to each other, second groups PR2*a*, PR2*b*, PR2*c*, and PR2*d* adjacent to each other, and third groups PR3*a*, PR3*b*, PR3*c*, and PR3*d* adjacent to each other.

The first groups PR1*a*, PR1*b*, PR1*c*, and PR1*d* may include 16 pixel substrate regions G1-G16, the second groups PR2*a*, PR2*b*, PR2*c*, and PR2*d* may include 16 pixel substrate regions B1-B16, and the third groups PR3*a*, PR3*b*, PR3*c*, and PR3*d* may include 16 pixel substrate regions R1-R16.

Each of the first groups PR1*a*, PR1*b*, PR1*c*, and PR1*d* may include four pixel substrate regions, each of the second groups PR2*a*, PR2*b*, PR2*c*, and PR2*d* may include four pixel substrate regions, and each of the third groups PR3*a*, PR3*b*, PR3*c*, and PR3*d* may include four pixel substrate regions.

The first groups PR1*a*, PR1*b*, PR1*c*, and PR1*d* may overlap color filters CF (in FIG. 4B) of a first color, the second groups PR2*a*, PR2*b*, PR2*c*, and PR2*d* may overlap the color filters CF (in FIG. 4B) of a second color, and the third groups PR3*a*, PR3*b*, PR3*c*, and PR3*d* may overlap the color filters CF (in FIG. 4B) of the third color. The first color may be green, the second color may be blue, and the third color may be red.

Each of the first groups PR1*a*, PR1*b*, PR1*c*, and PR1*d* may overlap a single color filter CF (in FIG. 4B) and a single microlens ML, each of the second groups PR2*a*, PR2*b*, PR2*c*, and PR2*d* may overlap a single color filter CF (in FIG. 4B) and a single microlens ML, and each of the third groups PR3*a*, PR3*b*, PR3*c*, and PR3*d* may overlap a single color filter CF (in FIG. 4B) and a single microlens ML.

The isolation structure 1215 corresponding to the isolation structure 215 (in FIGS. 3, 4A and 4B) described above may be provided. The isolation structure 1215 may include an isolation portion 1215*a* surrounding each of the groups PR, and extension portions 1215*b* extending from the isolation portion 1215*a* to a region between the plurality of pixel substrate regions G1-G16, B1-B16, and R1-R16 of each of the groups PR as illustrated in FIGS. 3 and 4A. The extension portions 1215*b* may be modified into various planar shapes as illustrated in FIGS. 8A to 8H as well as a planar shape as illustrated in FIG. 4A.

Figure 10:
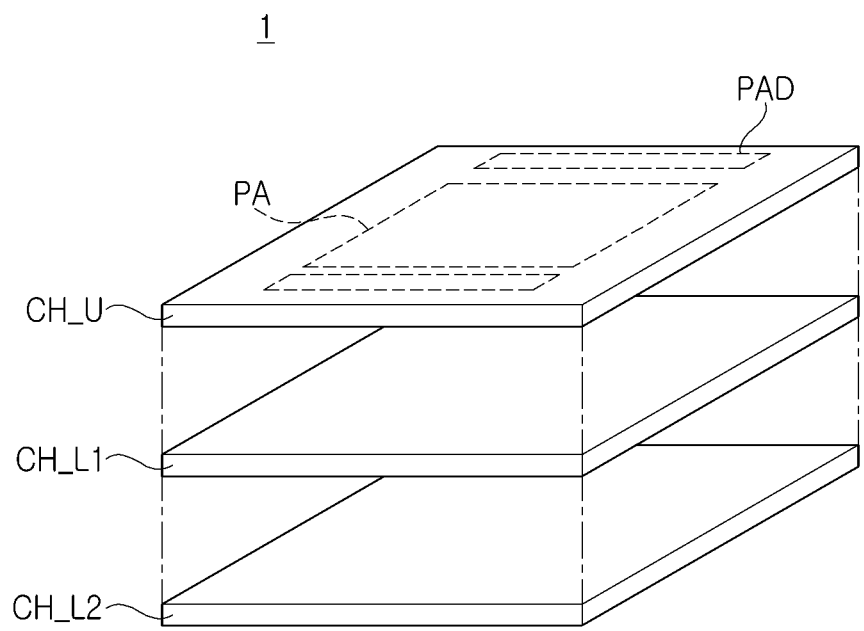
FIG. 10 is a perspective diagram illustrating an example of an image sensor according to an example embodiment of the disclosure.

As described above with reference to FIGS. 3, 4A and 4B, the image sensor 1 may have a stack chip structure to which at least two chips are applied. Hereinafter, an example in which the image sensor 1 has a stack chip structure in which three chips are stacked will be described with reference to FIG. 10. FIG. 10 is a perspective diagram illustrating an example of an image sensor according to an example embodiment.

Referring to FIG. 10, the image sensor 1 may include a first lower chip CH_L2, a second lower chip CH_L1, and an upper chip CH_U stacked in sequence and bonded to each other. The upper chip CH_U may include a pixel array PA and a pad region PAD provided on at least one side of the pixel array PA. The pad region PAD may be configured to transmit driving power such as a power voltage or a ground voltage supplied from an external entity to circuits in the image sensor 1.

The upper chip CH_U may be the second chip structure 203 as illustrated in FIG. 4B. In the upper chip CH_U, the pixel array PA may be the pixel array 10 described with reference to FIG. 1. The second lower chip CH_L1 may include the logic circuit 20 described with reference to FIG. 1. The first lower chip CH_L2 may be a volatile memory chip and/or a nonvolatile memory chip storing information.

Figure 11:
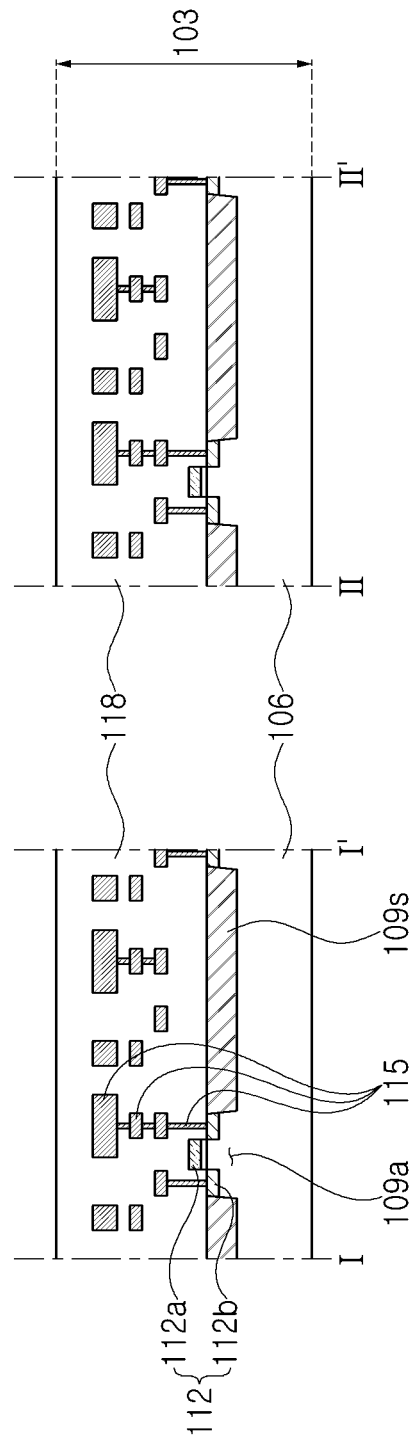
FIGS. 11 to 13 are cross-sectional diagrams illustrating a method of manufacturing an image sensor according to an example embodiment of the disclosure.
Figure 12:
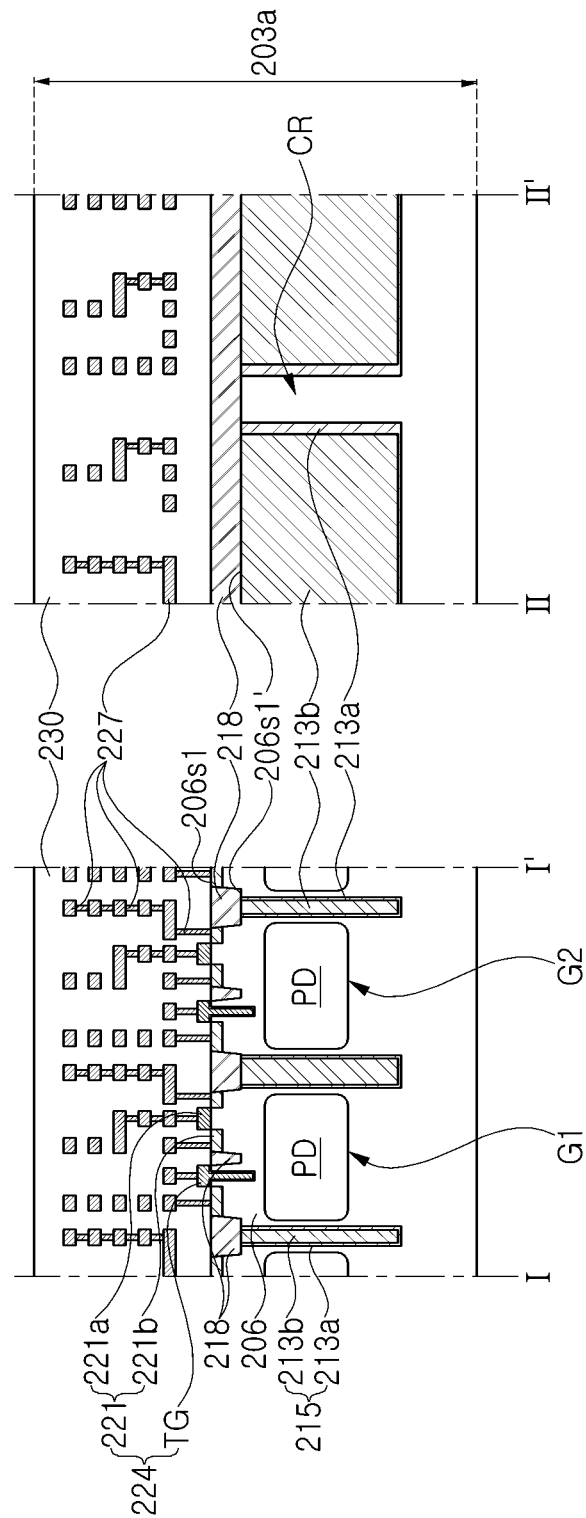
Figure 13:
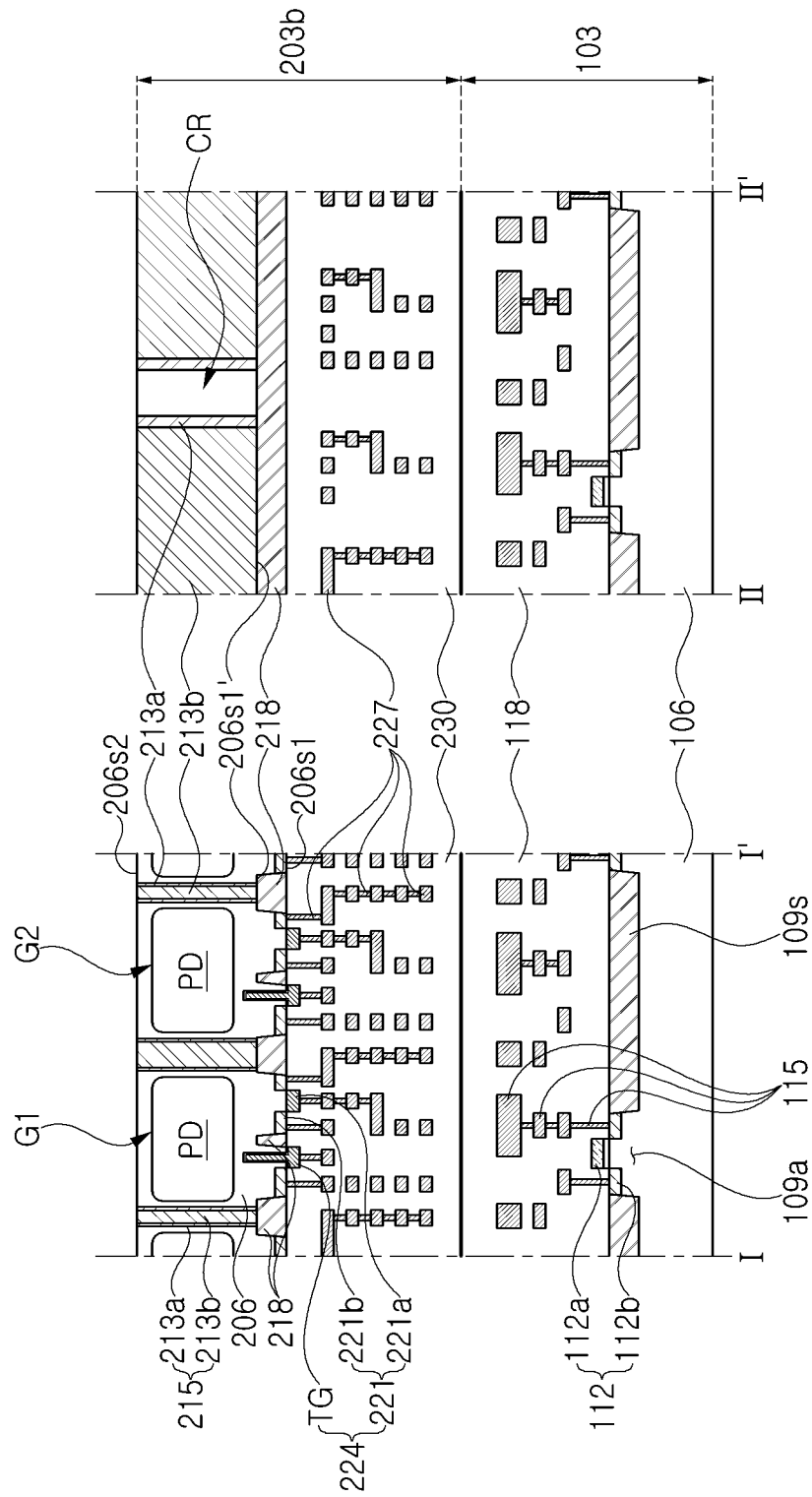

In the description below, an example of a method for manufacturing an image sensor according to an example embodiment will be described with reference to FIGS. 11 to 13. FIGS. 11 to 13 are cross-sectional diagrams illustrating a method of manufacturing an image sensor according to an example embodiment, illustrating regions taken along lines I-I' and II-II' in FIG. 4A.

Referring to FIG. 11, a method of forming a first chip structure 103 according to an example embodiment is illustrated. According to an example embodiment, the method of forming the first chip structure 103 may include preparing a first substrate 106, forming a device isolation layer 109*s* defining an active region 109*a* on the first substrate 106, forming a first circuit device 112 on a first substrate 106, and forming a first interconnection structure 115 electrically connected to the first circuit device 112 on the first substrate 106 and first insulating structure 118 covering the first circuit device 112 and the first interconnection structure 115.

Referring to FIG. 12, a method of forming a second chip 203*a* according to an example embodiment is illustrated. According to an example embodiment, the method of forming the second chip 203*a* may include forming an isolation structure 215 and photoelectric conversion device regions PD in the second substrate 206, forming an active region on the first surface 206*s*1 of the second substrate 206, forming a second circuit device 224 on the first surface 206*s*1 of the second substrate 206, and forming a second interconnection structure 227 and a second insulating structure 230 covering the second circuit device 224 and the second interconnection structure 227. The order of forming the isolation structure 215, the photoelectric conversion device regions PD, and the device isolation layer 218 may be variously modified according to other example embodiments.

In an example embodiment, forming the isolation structure 215 may include forming an isolation trench penetrating through the isolation layer 218 and extending into the second substrate 106, forming an isolation insulating layer 213a covering an inner wall of the lower isolation trench, and forming an isolation insulating layer 213b partially filling the isolation trench on the isolation insulating layer 213a.

Referring to FIG. 13, by performing a wafer bonding process for bonding two wafers to each other, the first chip structure 103 and the second chip 203a (in FIG. 11) may be bonded to each other. The first insulating structure 118 of the first chip structure 103 and the second insulating structure 230 of the second chip 103a may be bonded to each other. A grinding process for reducing the thickness of the second substrate 206 may be performed. The isolation structure 215 may be exposed while reducing the thickness of the second substrate 206.

Referring back to FIGS. 3, 4A and 4B, the insulating structure 240 may be formed on the second surface 106s2 of the second substrate 106. A grid structure 250 may be formed on the insulating structure 240. Color filters CF covering the grid structure 250 may be formed on the insulating structure 240, and microlenses ML may be formed on the color filters CF.

According to the aforementioned example embodiments, to improve autofocus capability, an image sensor including a pixel structure in which one microlens vertically overlaps a plurality of photodiodes may be provided. Accordingly, the plurality of pixels may share a microlens, such that autofocus capability of the image sensor may improve.

The image sensor may include an isolation structure including an isolation portion surrounding the plurality of pixels and extension portions extending to a region between the plurality of pixels and spaced apart from each other. Since the extension portions are spaced apart from each other, the center of the one microlens and the isolation structure may not vertically overlap. Light, collected by the single microlens, from being lost by the isolation structure may be reduced or prevented. Since loss of light focused by the microlens may be reduced or prevented, performance of the image sensor may improve.

Also, each of the extension portions may include a width reduction region of which a width decreases in a direction away from the isolation portion. Since the isolation structure includes the extension portions including the width reduction region, loss of light, collected by the microlens, by the extension portions of the isolation structure may be reduced.

Also, in the cross-sectional structure, the isolation structure may have an inclined side surface such that the width of the upper portion may be smaller than the width of the lower portion. Accordingly, loss of light, collected by the microlens, by the isolation structure may be reduced.

While the example embodiments have been illustrated and described above, it will be configured as apparent to those skilled in the art that modifications and variations could be made without departing from the scope of the disclosure as defined by the appended claims.

What is claimed is:

1. An image sensor, comprising:
a substrate having a first surface and a second surface on an opposite side of the first surface;
a circuit interconnection structure provided below the first surface of the substrate;
an area group comprising a plurality of pixel substrate regions provided in the substrate; and
an isolation structure provided in the substrate,
wherein the isolation structure comprises:
an isolation portion surrounding the area group, and
extension portions extending from the isolation portion into a region between a first pixel substrate region and a second pixel substrate region among the plurality of pixel substrate regions in the area group,
wherein, in the area group, the extension portions have end portions spaced apart from each other, and
wherein at least one of the extension portions comprises a first region in which a width decreases in a direction away from the isolation portion.

2. The image sensor of claim 1, wherein, in the at least one of the extension portions, a width of the first region decreases from a second region adjacent to the isolation portion in the direction away from the isolation portion.

3. The image sensor of claim 1,
wherein the at least one of the extension portions further comprises a second region provided between the first region and the isolation structure, and
wherein the second region has a width substantially equal to a maximum width of the first region.

4. The image sensor of claim 1,
wherein the at least one of the extension portions further comprises a second region and a third region,
wherein the second region has a width greater than a width of the third region,
wherein, in the at least one of the extension portions, the first region is provided between the second region and the third region, and the second region is provided between the first region and the isolation structure,
wherein the second region has substantially a same width, and
wherein the third region has substantially a same width.

5. The image sensor of claim 1, wherein the isolation structure comprises:
an isolation pattern provided in the isolation portion and extending into the extension portions, and
an isolation insulating layer provided between the isolation pattern and the substrate.

6. The image sensor of claim 5,
wherein the isolation pattern comprises polysilicon, and
wherein, in the isolation pattern of the at least one of the extension portions, an amount of polysilicon in the isolation pattern decreases from the isolation portion toward an end portion of the at least one of the extension portions.

7. The image sensor of claim 1, further comprising:
a plurality of color filters provided on the second surface of the substrate;
a plurality of microlenses provided on the plurality of color filters; and
an anti-reflection layer provided between the plurality of color filters and the second surface of the substrate,
wherein a plurality of area groups are provided in the substrate,
wherein each of the plurality of area groups comprises four pixel substrate regions among the plurality of pixel substrate regions,
wherein the isolation portion of the isolation structure surrounds each of the plurality of area groups,
wherein each of the plurality of microlenses vertically overlaps the four pixel substrate regions,
wherein the plurality of area groups comprises a first area group, wherein the extension portions comprise four extension portions, each of the four extension portions extending from the isolation portion to a region between four pixel substrate regions of the first area group, and wherein the substrate comprises an intermediate substrate region provided between end portions of the four extension portions.

8. The image sensor of claim 7, wherein the isolation structure extends from the second surface of the substrate toward the first surface of the substrate, and wherein at least a portion of the isolation structure extends from at least a portion of the anti-reflection layer.

9. The image sensor of claim 1, wherein the isolation structure comprises a lower isolation region and an upper isolation region on the lower isolation region, wherein the lower isolation region extends from the first surface of the substrate toward the second surface of the substrate, and wherein the upper isolation region extends from the second surface of the substrate toward the first surface of the substrate.

10. The image sensor of claim 9, wherein the lower isolation region comprises an isolation pattern and an isolation insulating layer provided between the isolation pattern and the substrate, wherein the upper isolation region is formed of an insulating material, wherein the isolation pattern comprises polysilicon, wherein the substrate comprises an intermediate substrate region provided between end portions of the extension portions adjacent to each other;

wherein the lower isolation region forms the isolation portion and the extension portions of the isolation structure, wherein the upper isolation region comprises an upper isolation portion overlapping the isolation portion of the lower isolation region, and upper extension portions extending from the upper isolation portion to a region between the plurality of pixel substrate regions and connected to each other, and wherein the upper extension portions of the upper isolation region vertically overlap the intermediate substrate region.

11. The image sensor of claim 9, wherein the lower isolation region comprises:
an isolation pattern and
an isolation insulating layer provided between the isolation pattern and the substrate, wherein the upper isolation region is formed of an insulating material, wherein the isolation pattern comprises polysilicon, wherein the substrate comprises an intermediate substrate region provided between end portions of the extension portions adjacent to each other, wherein the upper isolation region forms the isolation portion and the extension portions of the isolation structure, wherein the lower isolation region comprises a lower isolation portion overlapping the isolation portion of the upper isolation region, and lower extension portions extending from the lower isolation portion to a region between the plurality of pixel substrate regions and connected to each other, wherein the lower extension portions of the lower isolation region vertically overlap the intermediate substrate region, and wherein the lower extension portions of the lower isolation region vertically overlapping the intermediate substrate region comprise the polysilicon of the isolation pattern.

12. The image sensor of claim 1, wherein the isolation portion comprises:
a first line portion and a second line portion extending in a first direction and parallel to each other; and
a third line portion and a fourth line portion extending in a second direction perpendicular to the first direction and parallel to each other, wherein the extension portions comprise:
a first extension portion extending in a direction from the first line portion toward the second line portion;
a second extension portion extending in a direction from the second line portion toward the first line portion;
a third extension portion extending in a direction from the third line portion toward the fourth line portion; and
a fourth extension portion extending in a direction from the fourth line portion toward the third line portion, wherein the first to fourth line portions surround the area group, and wherein the first to fourth extension portions are spaced apart from each other.

13. An image sensor, comprising:
a lower chip comprising a logic circuit; and
an upper chip provided on the lower chip and bonded to the lower chip,
wherein the upper chip comprises:
a substrate having a first surface and a second surface on an opposite side of the first surface;
a circuit interconnection structure provided below the first surface of the substrate;
a plurality of area groups provided in the substrate, each of the plurality of area groups comprising a plurality of pixel substrate regions respectively comprising a photodiode;
an isolation structure provided in the substrate; and
microlenses vertically overlapping the plurality of area groups on the second surface of the substrate, wherein a first microlens among the microlenses vertically overlaps a first area group among the plurality of area groups, the first area group comprising a plurality of first pixel substrate regions, among the plurality of pixel substrate regions, wherein the first microlens vertically overlaps the plurality of first pixel substrate regions of the first area group, wherein the isolation structure comprises an isolation portion surrounding each of the plurality of area groups, and extension portions extending from the isolation portion to a region between the plurality of pixel substrate regions and spaced apart from each other, wherein each of the extension portions comprises a first region having a first width and a second region having a second width smaller than the first width, and wherein, in each of the extension portions, the first region is provided between the second region and the isolation portion.

14. The image sensor of claim 13, wherein a width of each of the extension portions gradually decreases from the first region to the second region.

15. The image sensor of claim 13, wherein the isolation structure comprises a silicon pattern and an insulating layer provided between the silicon pattern and the substrate.

16. The image sensor of claim 13, further comprising:
color filters provided between the second surface of the substrate and the microlenses,
wherein each of the plurality of area groups comprises four pixel substrate regions, and
wherein each of the color filters vertically overlaps the four pixel substrate regions.

17. An image sensor, comprising:
a lower chip comprising a logic circuit; and
an upper chip bonded to the lower chip on the lower chip, wherein the upper chip comprises:
a substrate having a first surface and a second surface on a side opposite to the first surface;
a circuit interconnection structure provided below the first surface of the substrate;
a plurality of area groups provided in the substrate, each of the plurality of area groups comprising a plurality of pixel substrate regions respectively comprising a photodiode;
an isolation structure provided in the substrate; and
microlenses vertically overlapping the plurality of area groups on the second surface of the substrate,
wherein a first microlens among the microlenses vertically overlaps a first area group among the plurality of area groups, the first area group comprising a plurality of first pixel substrate regions, among the plurality of pixel substrate regions,
wherein the first microlens vertically overlaps the plurality of first pixel substrate regions of the first area group,
wherein the isolation structure comprises an isolation portion surrounding each of the plurality of area groups, and extension portions extending from the isolation portion to a region between the plurality of pixel substrate regions and spaced apart from each other,
wherein the isolation structure has an inclined side surface,
wherein the isolation structure has a first width in a lower portion adjacent to the first surface of the substrate, and a second width smaller than the first width in an upper portion adjacent to the second surface of the substrate,
wherein each of the extension portions comprises a first region having a third width and a second region having a fourth width smaller than the third width, and
wherein, in each of the extension portions, the first region is provided between the second region and the isolation portion.

18. The image sensor of claim 17,
wherein, in each of the extension portions, the second region is adjacent to a center of each of the plurality of area groups and the first region is adjacent to the isolation portion.

19. The image sensor of claim 17, wherein, in each of the extension portions, the third width of the first region decreases in a direction away from the isolation portion.

20. The image sensor of claim 17,
wherein a center of the first microlens is the thickest in the first microlens, and
wherein, in the substrate, a region of the substrate provided between the extension portions vertically overlaps the center of the first microlens.

* * * * *